US012783753B2

(12) United States Patent
Kang et al.

(10) Patent No.: US 12,783,753 B2
(45) Date of Patent: Nov. 3, 2026

(54) SIMULATION APPARATUS AND SIMULATION METHOD OF ROLL-PRESS FOR SECONDARY BATTERY PRODUCTION

(71) Applicant: LG Energy Solution, Ltd., Seoul (KR)

(72) Inventors: Shinkyu Kang, Daejeon (KR); Sung Nam Cho, Daejeon (KR); Youngduk Kim, Daejeon (KR); Nam Hyuck Kim, Daejeon (KR); Gyeong Yun Jo, Daejeon (KR); Su Ho Jeon, Daejeon (KR); Han Seung Kim, Daejeon (KR); Junhyeok Jeon, Daejeon (KR)

(73) Assignee: LG Energy Solution, Ltd., Seoul (KR)

(*) Notice: Subject to any disclaimer, the term of this patent is extended or adjusted under 35 U.S.C. 154(b) by 776 days.

(21) Appl. No.: 18/273,154

(22) PCT Filed: Jul. 19, 2022

(86) PCT No.: PCT/KR2022/010541

§ 371 (c)(1),
(2) Date: Jul. 19, 2023

(87) PCT Pub. No.: WO2023/101129

PCT Pub. Date: Jun. 8, 2023

(65) Prior Publication Data

US 2024/0119194 A1 Apr. 11, 2024

(30) Foreign Application Priority Data

Nov. 30, 2021 (KR) ........................ 10-2021-0169453

(51) Int. Cl.
*G06F 30/20* (2020.01)

(52) U.S. Cl.
CPC .................................... *G06F 30/20* (2020.01)

(58) Field of Classification Search
None
See application file for complete search history.

(56) References Cited

U.S. PATENT DOCUMENTS

| | | | | |
|---|---|---|---|---|
| 9,971,982 B2 | 5/2018 | Ishibashi et al. | | |
| 2012/0276455 A1* | 11/2012 | Nishimura | ............ | H01M 4/621 429/232 |

(Continued)

FOREIGN PATENT DOCUMENTS

| | | | | |
|---|---|---|---|---|
| CN | 101105816 A | 1/2008 | | |
| CN | 102047478 A * | 5/2011 | .......... | H01M 4/8605 |

(Continued)

*Primary Examiner* — Shelley Chen

(74) *Attorney, Agent, or Firm* — Bryan Cave Leighton Paisner LLP

(57) ABSTRACT

A simulation method and a simulation apparatus of roll press for secondary battery production are provided. The simulation apparatus comprises a memory configured to store at least one instruction; and at least one processor configured to execute the at least one instruction stored in the memory, the at least one instruction comprising instructions for executing a device operation unit comprising a 3D roll press associated with secondary battery production, a facility operation unit comprising a plurality of adjustment parameters for determining the operation of the 3D roll press, a main operation panel comprising a plurality of buttons for driving a 3D roll press, and a quality confirmation unit comprising quality information related to the quality of a material produced by the 3D roll press; obtaining at least one of first user behavior information obtained through the device operation unit, button manipulation information obtained through the main operation panel, or first user condition information obtained through the facility operation unit; determining an operation of the 3D roll press based on at least one of the obtained first user behavior information, the obtained button manipulation information, or the obtained first user condition information; and executing the operation of 3D roll press based on the determined operation.

15 Claims, 20 Drawing Sheets

(56) References Cited

U.S. PATENT DOCUMENTS

| | | | | | |
|---|---|---|---|---|---|
| 2013/0017434 | A1* | 1/2013 | Shimizu | H01M 4/13 429/211 | |
| 2020/0321080 | A1* | 10/2020 | Ravikumar | G16C 20/50 | |

FOREIGN PATENT DOCUMENTS

| | | | | | |
|---|---|---|---|---|---|
| CN | 105190724 | A | | 12/2015 | |
| CN | 107103811 | A | | 8/2017 | |
| CN | 108846561 | A | * | 11/2018 | G06Q 10/06315 |
| CN | 108958071 | A | | 12/2018 | |
| CN | 110262284 | A | | 9/2019 | |
| CN | 110737981 | A | | 1/2020 | |
| CN | 111834605 | A | | 10/2020 | |
| CN | 111900336 | A | | 11/2020 | |
| EP | 4261806 | A1 | | 10/2023 | |
| JP | 2010-231792 | A | | 10/2010 | |
| JP | 2012230839 | A | * | 11/2012 | H01M 4/621 |
| JP | 6962373 | A1 | | 10/2020 | |
| JP | 2020-184419 | A | | 11/2020 | |
| JP | 6893275 | B1 | | 6/2021 | |
| KR | 1020090050651 | A | | 5/2009 | |
| KR | 101203162 | B1 | | 11/2012 | |
| KR | 10-1523015 | A | | 1/2014 | |
| KR | 101594656 | B1 | | 2/2016 | |
| KR | 101853349 | B1 | | 4/2018 | |
| KR | 10-2018-0073116 | A | | 7/2018 | |
| KR | 10-2018-0115425 | A | | 10/2018 | |
| KR | 101933533 | B1 | | 4/2019 | |
| KR | 102331219 | B1 | | 11/2021 | |
| KR | 20230081413 | A | * | 6/2023 | H01M 4/0435 |
| WO | 1993-08552 | A1 | | 4/1993 | |
| WO | WO-2016040878 | A1 | * | 3/2016 | G06F 9/453 |
| WO | 2021140747 | A1 | | 7/2021 | |

* cited by examiner

SIMULATION APPARATUS AND SIMULATION METHOD OF ROLL-PRESS FOR SECONDARY BATTERY PRODUCTION

CROSS-REFERENCE TO RELATED APPLICATION(S)

This application is a National Stage Application of International Application No. PCT/KR2022/010541 filed on Jul. 19, 2022, which claims priority to Korean Patent Application No. 10-2021-0169453 filed on Nov. 30, 2021, the disclosures of which are incorporated herein by reference in their entireties.

FIELD

The present disclosure relates to a simulation apparatus and a simulation method of roll press for secondary battery production and, more specifically, to a simulation apparatus and a simulation method of roll press for training secondary battery production workers.

BACKGROUND

Due to the recent growth of the electric vehicle market, the demand for developing and producing secondary batteries is rapidly increasing. The number of production plants for secondary battery production is also growing in response to the increase in demand for secondary batteries. However, the industry is experiencing a significant shortage of skilled workers for operating secondary battery production plants.

Meanwhile, in the past, training and education of new workers were carried out in such a way of learning a skill by watching experienced workers, but it became difficult to train and educate new workers for a long time due to the busy production schedule of secondary batteries. In addition, it is difficult to find a sufficient number of skilled workers due to the frequent resignation of workers. In addition, even if a worker is trained in a general method of operating a factory, it is not easy for the worker to immediately respond to various defect situations that may occur during factory operation.

SUMMARY

To solve the problem above, the present disclosure provides a simulation apparatus (system) and a simulation method of roll press for secondary battery production, a computer program stored in a computer-readable medium, and a computer-readable medium storing the computer program.

The present disclosure may be implemented in various ways including an apparatus (system) and method, a computer program stored in a computer-readable medium, or a computer-readable medium storing the computer program.

According to an embodiment of the present disclosure, a simulation apparatus for secondary battery production includes: a memory configured to store at least one instruction; and at least one processor configured to execute at least one instruction stored in the memory, wherein the at least one instruction includes instructions for: executing an apparatus operating unit including a 3D roll press related to secondary battery production, a facility operating unit including a plurality of adjustment parameters for determining an operation of the 3D roll press, a main operation panel including a plurality of buttons for operating the 3D roll press, and a quality checking unit including quality information related to quality of a material produced by the 3D roll press; obtaining at least one of first user action information obtained through the apparatus operating unit, button manipulation information obtained through the main operation panel, or first user condition information obtained through the facility operating unit; determining an operation of the 3D roll press based on at least one of the obtained first user action information, button manipulation information or first user condition information; and executing an operation of the 3D roll press based on the determined operation.

According to an embodiment of the present disclosure, the at least one instruction may further include instructions for: changing an adjustment parameter displayed on the facility operating unit based on the first user action information obtained through the apparatus operating unit.

According to an embodiment of the present disclosure, the at least one instruction may further include instructions for: executing a 3D roll press training scenario based on an operating process of the 3D roll press; executing, according to the 3D roll press training scenario, at least one of operating the 3D roll press in animation, displaying a user action guide image on the apparatus operating unit, displaying a button manipulation guide image on the main operation panel, or displaying a user condition input guide image on the facility operating unit; obtaining at least one of the first user action information, the button manipulation information, or the first user condition information; and changing at least one of the apparatus operating unit, the facility operating unit, or the main operation panel based on at least one of the obtained first user action information, button manipulation information or first user condition information.

According to an embodiment of the present disclosure, the 3D roll press training scenario may include at least one of a work specification checking training step, an edge position control (EPC) adjustment training step, a tension adjustment training step, a roll gap adjustment training step, a counter-pressure adjustment training step, or a quality checking training step.

According to an embodiment of the present disclosure, the at least one instruction may further include instructions for: determining one or more quality parameters for determining the quality of the material produced by the 3D roll press; calculating a value corresponding to each of the determined one or more quality parameters based on the operation of the 3D roll press being executed while the operation of the 3D roll press is in execution; and generating quality information related to the quality of the material produced by the 3D roll process based on the calculated value corresponding to each of the determined one or more quality parameters and displaying the quality information on the quality checking unit.

According to an embodiment of the present disclosure, the at least one instruction may further include instructions for: determining one or more case training scenarios among a plurality of case training scenarios related to the quality of the material produced by the 3D roll press; and changing at least one of the operation of the 3D roll press or the quality information related to the quality of the material based on the determined one or more case training scenarios.

According to an embodiment of the present disclosure, the case training scenario may include at least one of: a total thickness defect scenario in which a total thickness of the material deviates from an upper or lower limit of specification, an operator side thickness defect scenario in which an operator side thickness of the material deviates from an upper or lower limit of the specification, a drive side thickness defect scenario in which a drive side thickness of the material deviates from an upper or lower limit of the specification, or a side thickness defect scenario in which a side thickness of the material deviates from an upper or lower limit of the specification.

According to an embodiment of the present disclosure, the at least one instruction may further include instructions for: executing at least one defect scenario of the total thickness defect scenario, the operator side thickness defect scenario, the drive side thickness defect scenario, and the side thickness defect scenario; obtaining at least one of second user action information of dragging at least a partial area of the 3D roll press or second user condition information of changing an adjustment parameter of the facility operating unit; correcting the 3D roll press in animation based on at least one of the obtained second user action information or second user condition information; calculating a value corresponding to each of one or more quality parameters related to quality of a material produced by the corrected 3D roll press; and correcting the quality information related to the quality of the material produced by the corrected 3D roll press based on the calculated value corresponding to each of the one or more quality parameters and displaying the corrected quality information on the quality checking unit.

According to an embodiment of the present disclosure, the at least one instruction may further include instructions for: outputting guide information including condition information and action information required to resolve the one or more defect scenarios.

According to an embodiment of the present disclosure, a simulation method of roll press for secondary battery production, being executed by at least one process, includes: executing an apparatus operating unit including a 3D roll press related to secondary battery production, a facility operating unit including a plurality of adjustment parameters for determining an operation of the 3D roll press, a main operation panel including a plurality of buttons for operating the 3D roll press, and a quality checking unit including quality information related to quality of a material produced by the 3D roll press; obtaining at least one of first user action information obtained through the apparatus operating unit, button manipulation information obtained through the main operation panel, or first user condition information obtained through the facility operating unit; determining an operation of the 3D roll press based on at least one of the obtained first user action information, button manipulation information or first user condition information; and executing an operation of the 3D roll press based on the determined operation.

According to an embodiment of the present disclosure, the simulation method may further include: changing an adjustment parameter displayed on the facility operating unit based on the first user action information obtained through the apparatus operating unit.

According to an embodiment of the present disclosure, the simulation method may further include: executing a 3D roll press training scenario based on an operating process of the 3D roll press; executing, according to the 3D roll press training scenario, at least one of operating the 3D roll press in animation, displaying a user action guide image on the apparatus operating unit, displaying a button manipulation guide image on the main operation panel, or displaying a user condition input guide image on the facility operating unit; obtaining at least one of the first user action information, the button manipulation information, or the first user condition information; and changing at least one of the apparatus operating unit, the facility operating unit, or the main operation panel based on at least one of the obtained first user action information, button manipulation information or first user condition information.

According to an embodiment of the present disclosure, the 3D roll press training scenario may include at least one of a work specification checking training step, an edge position control (EPC) adjustment training step, a tension adjustment training step, a roll gap adjustment training step, a counter-pressure adjustment training step, or a quality checking training step.

According to an embodiment of the present disclosure, the simulation method may further include: determining one or more quality parameters for determining the quality of the material produced by the 3D roll press; calculating a value corresponding to each of the determined one or more quality parameters based on the operation of the 3D roll press being executed while the operation of the 3D roll press is in execution; and generating quality information related to the quality of the material produced by the 3D roll process based on the calculated value corresponding to each of the determined one or more quality parameters and displaying the quality information on the quality checking unit.

According to an embodiment of the present disclosure, the simulation method may further include: determining one or more case training scenarios among a plurality of case training scenarios related to the quality of the material produced by the 3D roll press; and changing at least one of the operation of the 3D roll press or the quality information related to the quality of the material based on the determined one or more case training scenarios.

According to an embodiment of the present disclosure, the case training scenario may include at least one of: a total thickness defect scenario in which a total thickness of the material deviates from an upper or lower limit of specification, an operator side thickness defect scenario in which an operator side thickness of the material deviates from an upper or lower limit of the specification, a drive side thickness defect scenario in which a drive side thickness of the material deviates from an upper or lower limit of the specification, or a side thickness defect scenario in which a side thickness of the material deviates from an upper or lower limit of the specification.

According to an embodiment of the present disclosure, the simulation method may further include: executing at least one defect scenario of the total thickness defect scenario, the operator side thickness defect scenario, the drive side thickness defect scenario, and the side thickness defect scenario; obtaining at least one of second user action information of dragging at least a partial area of the 3D roll press or second user condition information of changing an adjustment parameter of the facility operating unit; correcting the 3D roll press in animation based on at least one of the obtained second user action information or second user condition information; calculating a value corresponding to each of one or more quality parameters related to quality of a material produced by the corrected 3D roll press; and correcting the quality information related to the quality of the material produced by the corrected 3D roll press based on the calculated value corresponding to each of the one or more quality parameters and displaying the corrected quality information on the quality checking unit.

According to an embodiment of the present disclosure, the simulation method may further include: outputting guide information including condition information and action information required to resolve the one or more defect scenarios.

A computer program stored in a computer-readable medium is provided to execute the simulation method according to an embodiment of the present disclosure on a computer.

In various embodiments of the present disclosure, a user performing secondary battery production may perform training related to a method of operating a secondary battery production apparatus, a method of handling a defect situation, and so on through a simulation apparatus before being put into work; through training of the user, the loss due to the occurrence of defects may be considerably reduced so that the efficiency of the secondary battery production task may be improved effectively.

In various embodiments of the present disclosure, by generating a defect scenario based on error information in an actual apparatus, the simulation apparatus may effectively generate training contents optimized for actual work environments.

In various embodiments of the present disclosure, a simulation apparatus may generate and provide a defect scenario having various values related to the malfunction of a secondary battery production apparatus to the user; accordingly, the user may deal with a malfunction situation that may occur in an actual apparatus without help from others and may effectively learn how to respond to various situations.

In various embodiments of the present disclosure, a user may easily learn how to operate a secondary battery production apparatus through the simulation progressed step by step according to the user's task skill level.

In various embodiments of the present disclosure, a user may easily identify and process a defect scenario for which the user lacks training; thus, the user may be trained only in the defect scenario for which the user has low work skills.

In various embodiments of the present disclosure, a user may effectively improve the ability to respond to defects by training using a defect scenario generated based on a malfunction occurring in an actual work environment.

The technical effects of the present disclosure are not limited to the technical effects described above, and other technical effects not mentioned herein may be understood clearly by those with ordinary knowledge in the art (referred to as a "person with ordinary skills") to which the present disclosure belongs from the appended claims.

BRIEF DESCRIPTION OF THE DRAWINGS

Embodiments of the present disclosure will be described with reference to the accompanying drawings described below, wherein similar reference numbers denote similar constituting elements, but the present disclosure is not limited thereto.

DESCRIPTION OF REFERENCE NUMERAL

Figure 1:
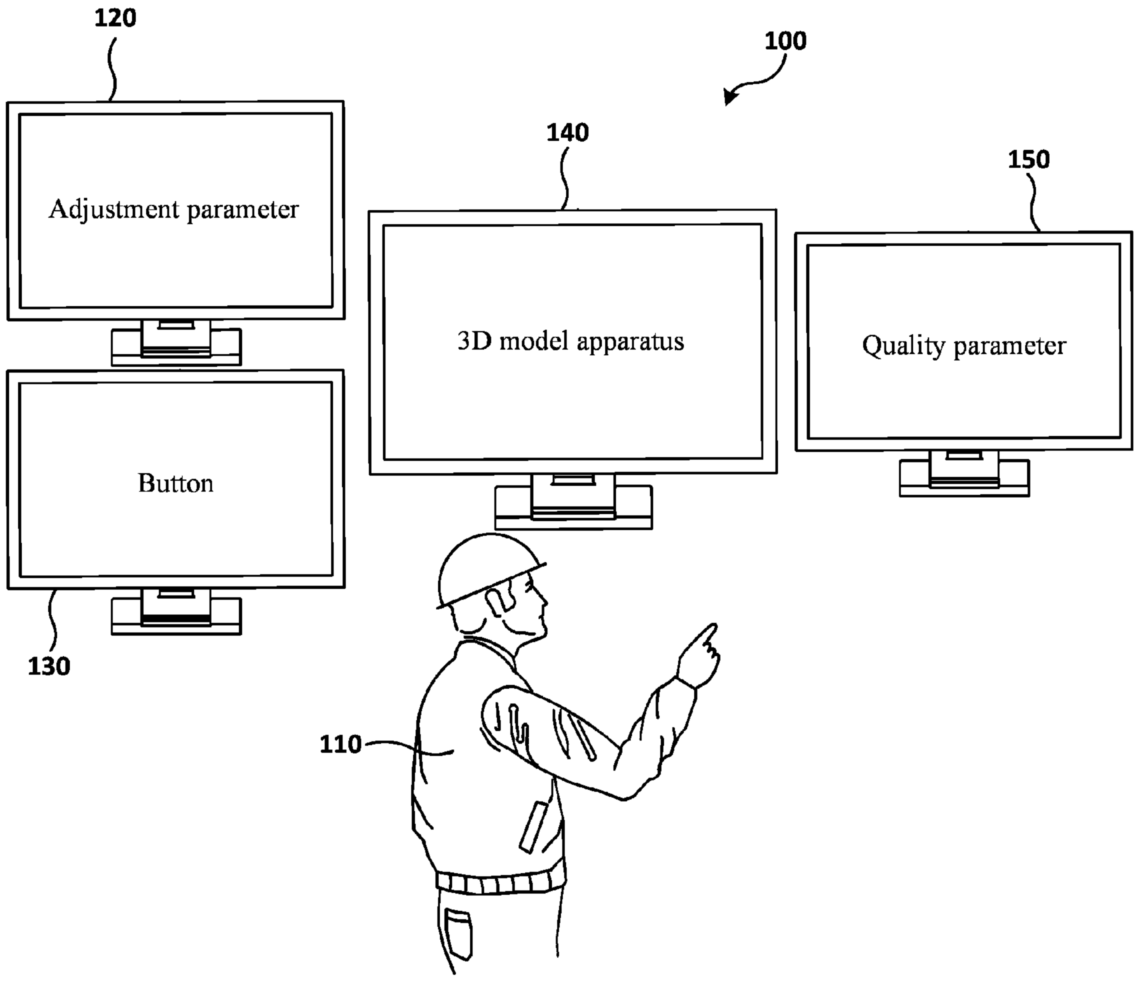
FIG. 1 illustrates an example in which a user uses a simulation apparatus according to an embodiment of the present disclosure.

100: Simulation apparatus
110: User
120: Facility operating unit
130: Main operation panel
140: Apparatus operating unit
150: Quality checking unit

DETAILED DESCRIPTION

Hereinafter, specifics for embodiment of the present disclosure will be described in detail with reference to appended drawings. However, in what follows, if a detailed description of well-known functions or configurations incorporated herein unnecessarily obscure the gist of the present disclosure, the detailed description thereof will be omitted.

In the accompanying drawings, identical or corresponding constituting elements are assigned the same reference numbers. In addition, overlapping descriptions of the same or corresponding constituting elements may be omitted in the description of the embodiments below. However, even if descriptions regarding a constituting element are omitted, it should not be interpreted that the constituting element is not included in the corresponding embodiment.

The advantages and features of the present disclosure, and a method of achieving them will be clearly understood with reference to the embodiments described together with appended drawings. However, the present disclosure is not limited to the embodiments disclosed below but may be implemented in various other forms; the present embodiments are provided only to inform those skilled in the art completely of the technical scope of the present disclosure.

Terms used in the present disclosure will be briefly defined, and disclosed embodiments will be described in detail. Terms used in the present disclosure have been selected as much as possible from general terms relevant to the functions of the present disclosure and currently in wide use; however, the selection of terms may be varied depending on the intention of those persons skilled in the corresponding field, precedents, or emergence of new technologies. In addition, in a particular case, some terms may be selected arbitrarily by the applicant, and in this case, detailed definitions of the terms will be provided in the corresponding description of the present disclosure. Therefore, the terms used in the present disclosure should be defined not simply by their apparent name but based on their meaning and context throughout the present disclosure.

In the present disclosure, a singular expression should be understood to include a plural expression unless the context explicitly indicates a singular expression. In addition, a plural expression should be understood to include a singular expression unless the context explicitly indicates a plural expression. Throughout the disclosure, unless otherwise explicitly stated, if a particular element is said to include some particular element, it means that the former may further include other particular elements rather than exclude them.

The term "comprises (includes)" and/or "comprising (including)" used in the present disclosure indicates the existence of features, steps, operations, components, and/or constituting elements; however, the term does not exclude addition of one or more other functions, steps, operations, components, constituting elements, and/or a combination thereof.

In the present disclosure, when a particular constituting element is referred to as being "coupled to," "combined with," "connected to," "related to," or as "responding to" any other constituting element, the particular constituting element may be directly coupled to, combined with, connected to, and/or related to, or may directly respond to the other constituting element; however, the present disclosure is not limited to the relationship. For example, there may be one or more intermediate constituting elements between a particular constituting element and another constituting element. In addition, in the present disclosure, "and/or" may include one or more of the listed items or a combination of at least a portion of one or more of the listed items.

In the present disclosure, the terms such as "first" and "second" are introduced to distinguish one constituting element from the others, and thus the constituting element should not be limited by those terms. For example, a "first" constituting element may be used to indicate a constituting element in a form similar to or the same as a "second" constituting element.

In the present disclosure, a "secondary battery" may refer to the battery made using a material in which the redox process between a current and the material may be repeated several times. For example, to produce a secondary battery, processing such as mixing, coating, roll pressing, slitting, notching and drying, lamination, folding and stacking, lamination and stacking, packaging, charging and discharging, degassing, and characteristic inspection may be performed. In this case, separate production equipment (apparatus) for performing each process may be used. At this time, each production equipment may be operated according to adjustment parameters and configuration values set or changed by a user.

In the present disclosure, a "user" may refer to a worker who performs secondary battery production and operates secondary battery production equipment and may include a user training through a simulation apparatus for secondary battery production equipment. In addition, a "user account" is an ID created to use the simulation apparatus or assigned to each user; the user may log into the simulation apparatus using the user account and perform a simulation, but the present disclosure is not limited thereto.

In the present disclosure, the "facility operating unit," "apparatus operating unit," and "quality checking unit" are software programs included in the simulation apparatus or displayed on an input/output device related to the simulation apparatus and/or an input/output device and may refer to a device and/or a program outputting an image or a video of a 3D model apparatus or receiving various inputs from a user and delivering the received inputs to the simulation apparatus.

In the present disclosure, the "3D model apparatus" is a virtual apparatus that implements actual secondary battery production equipment, which may operate in a way that images, videos, or animations of the virtual apparatus are executed, modified, and/or corrected based on the information input by a user (e.g., user input information and/or user action information and/or button manipulation information). In other words, the "operation of the 3D model apparatus" may include images, videos, and animations of a virtual apparatus executed, modified, and/or corrected. For example, the 3D model apparatus may include apparatus for performing mixing, coating, roll pressing, slitting, notching and drying, lamination, folding and stacking, lamination and stacking, packaging, charging/discharging, degassing, and characteristic inspection. Additionally or alternatively, the 3D model apparatus may be implemented as a 2D model apparatus. In other words, in the present disclosure, the 3D model apparatus is not limited to a 3D model but may include a 2D model. Accordingly, the 3D model apparatus may include terms such as a 2D model apparatus, an animation model apparatus, and a virtual model apparatus.

In the present disclosure, "user condition information" may include a user input that sets or modifies at least part of conditions and/or values among adjustment parameters or may correspond to the information generated by an arbitrary algorithm predetermined based on the corresponding user input.

In the present disclosure, "user action information" may include a user input such as a touch input, a drag input, a pinch input, and a rotation input performed on at least part of the 3D model apparatus or may correspond to the information generated by an arbitrary algorithm predetermined based on the corresponding user input.

In the present disclosure, a "defect scenario" may be a scenario that changes the operation of a 3D model apparatus within a malfunction range or includes values or conditions for changing quality information of a material determined by the operation of the 3D model apparatus into a defect range. For example, when a defect scenario occurs during the operation of the simulation apparatus, the operation or quality information of the 3D model apparatus may be changed based on the generated defect scenario. In addition, when the operation or quality information of the 3D model apparatus changed by the defect scenario is corrected to lie within a normal range, the corresponding defect scenario may be determined as having been resolved.

In the present disclosure, the "training scenario" may include a scenario for operating secondary battery production equipment. For example, if the secondary battery production equipment is a roll press, the training scenario may include a work specification checking training step, an edge position control (EPC) adjustment training step, a tension adjustment training step, a roll gap adjustment training step, a counter-pressure adjustment training steps, a quality checking training step, and the like. Here, the training scenario may include defect scenarios.

In the present disclosure, the "mixing process" may be a process of producing slurry by mixing active material, a binder, and other additives with a solvent. For example, a user may determine or adjust the addition ratio of active material, conductive material, additives, and a binder to produce slurry of specific quality. In addition, in the present disclosure, the "coating process" may be a process of applying the slurry on the foil with a particular amount and shape. For example, a user may determine or adjust a coater apparatus's die or slurry temperature to perform coating with a quantity and a shape of specific quality.

In the present disclosure, the "roll pressing process" may be a process in which coated electrodes are passed between two rotating upper and lower rolls and pressed to a certain thickness. For example, a user may determine or adjust the spacing between rolls to maximize the cell capacity by increasing the electrode density through the roll pressing process. In addition, in the present disclosure, the "slitting process" may be a process of passing electrodes between two upper and lower rotating knives and cutting the electrodes to have a predetermined width. For example, a user may determine or adjust various adjustment parameters to maintain a constant electrode width.

In the present disclosure, the "notching and drying process" may be a process of removing moisture after punching out an electrode into a particular shape. For example, a user may determine or adjust a cutting height, a length and the like to punch the electrode into a particular shape with specific quality. In addition, in the present disclosure, the "lamination process" may be a process of sealing and cutting the electrode and the separator. For example, a user may determine or adjust a value corresponding to the x-axis and a value corresponding to the y-axis to perform cutting at a specific quality.

In the present disclosure, the "package process" may be a process of attaching a lead and a tape to an assembled cell and packaging the assembled cell in an aluminum pouch, and the "degas process" may be a process of removing the gas in the cell to prevent inflow of air into the cell and leakage of electrolyte. In addition, in the present disclosure, the "characteristic inspection process" may be a process of checking characteristics such as thickness, weight, and insulation voltage of a cell using a measurement device or vision before shipment of the cell. For the processes above, a user may adjust conditions or values of various adjustment parameters or change configuration values corresponding to the apparatus so that each process is performed with specific quality within a normal range.

FIG. 1 illustrates an example in which a user 110 uses a simulation apparatus 100 according to an embodiment of the present disclosure. As illustrated in the figure, the simulation apparatus 100 is used for training a secondary battery production worker (e.g., user 110) and may include, for example, a facility operating unit 120, a main operation panel 130, an apparatus operating unit 140, and a quality checking unit 150. For example, the user 110 may operate the simulation apparatus 100 which implements the actual secondary battery production equipment virtually (e.g., 2D, 3D, etc.) and learn how to use the secondary battery production equipment or how to respond when the quality of the manufactured product is degraded.

According to an embodiment, the facility operating unit 120 may include a plurality of adjustment parameters for determining the operation of the 3D model apparatus displayed on the apparatus operating unit 140, and the user 110 may execute, change, and/or correct the operation of the 3D model apparatus by changing at least part of the conditions among a plurality of adjustment parameters. In other words, the operation of the 3D model apparatus may be changed or corrected adaptively as the adjustment parameters input by the user 110 are changed.

The main operation panel 130 may include a plurality of buttons for operating the 3D model apparatus displayed on the apparatus operating unit 140. The user 100 may execute, modify, and/or correct the operation of the 3D model apparatus by manipulating at least some buttons of the plurality of buttons.

The apparatus operating unit 140 may include a 3D model apparatus related to the production of secondary batteries. Here, the 3D model apparatus may include, but not limited to, a 3D model related to secondary battery production equipment such as, but not limited to, a mixer, a coater, a slitter, a roll presser, a lamination apparatus, and a lamination & stack (L&S) apparatus, and may include a 3D model of any other apparatus used for the production of secondary batteries. According to an embodiment, the user 110 may manipulate the 3D model apparatus or change the configuration of the 3D model apparatus by applying a touch input, a drag input, or a pinch input to the 3D model apparatus (at least part of the 3D model apparatus) included in the apparatus operating unit 140. In this case, the user 110 may check or enlarge/reduce an arbitrary area of the 3D model apparatus through view switching, operate the 3D model apparatus by performing a touch input, or change the configuration of the 3D model apparatus. Here, it is assumed that the apparatus operating unit 140 displays a 3D model apparatus related to secondary battery production; however, the present disclosure is not limited to the assumption, and thus, an apparatus related to a specific process in the secondary battery production process may be implemented and displayed as a 2D model apparatus.

The quality checking unit 150 may include quality information related to the quality of the material produced by the 3D model apparatus. Here, the quality information may be generated by performing an operation on the quality parameter based on a predetermined criterion and/or algorithm. That is, the user 110 may check the quality information of the material generated in response to changing the adjustment parameter or manipulating the button and/or the 3D model apparatus through the quality checking unit 150. Additionally or alternatively, according to the secondary battery production process, the quality checking unit 150 for a specific process may be included in the apparatus operating unit 140. In this case, the quality information may be displayed in association with the 3D model apparatus of the apparatus operating unit 140, checked by a specific operation of the 3D model apparatus, or additionally displayed on a screen of a partial area of the 3D model apparatus. For example, when a button for checking quality displayed on the apparatus operating unit 140 is selected, quality information may be displayed or output. In another example, quality information may be displayed or output by changing a color of at least a portion of the 3D model apparatus.

In FIG. 1, the simulation apparatus 100 is illustrated as including one facility operating unit 120 and one quality checking unit 150; however, the present disclosure is not limited to the specific illustration, and an arbitrary number of facility operating units 120 and quality checking unit 150 may be employed depending on the type of 3D model apparatus related to the simulation apparatus 100. With such a configuration, the user 110 performing secondary battery production may be trained in a method of operating the secondary battery production equipment, a method of responding to a defect situation before being put into work, and the like; by training the user 110 as described above, loss due to the occurrence of defects may be considerably reduced, and thus, the efficiency of the secondary battery production task may be improved effectively.

Figure 2:
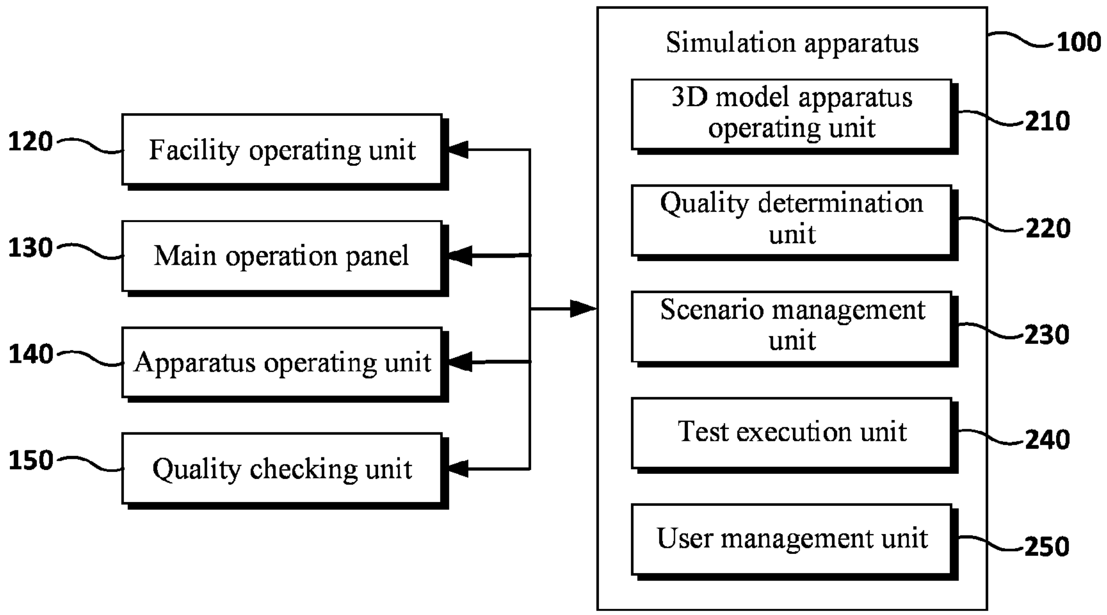
FIG. 2 is a functional diagram illustrating an internal structure of a simulation apparatus according to an embodiment of the present disclosure.

FIG. 2 is a functional diagram illustrating an internal structure of a simulation apparatus 100 according to an embodiment of the present disclosure. As illustrated in the figure, the simulation apparatus 100 (e.g., at least one processor of the simulation apparatus 100) may include, but not limited to, a 3D model apparatus operating unit 210, a quality determination unit 220, a scenario management unit 230, a test execution unit 240, and a user management unit 250. The simulation apparatus 100 may communicate with the facility operating unit 120, the main operation panel 130, the apparatus operating unit 140, and the quality checking unit 150, and exchange data and/or information related to the 3D model apparatus.

The 3D model apparatus operating unit 210 may execute, change, and/or correct the operation of the 3D model apparatus displayed on the apparatus operating unit 140 according to a user's manipulation. According to an embodiment, the 3D model apparatus operating unit 210 may obtain or receive user action information, button manipulation information and/or user condition information using information input from the user (e.g., a secondary battery production worker). Then, the 3D model apparatus operating unit 210 may determine or change the operation of the 3D model apparatus using the obtained or received user action information, button manipulation information and/or user condition information.

According to an embodiment, the user action information is generated based on a user input such as touching and/or dragging at least part of an area of the 3D model apparatus included in the apparatus operating unit 140 and may include the information on the amount of change in a setting value of the 3D model apparatus according to the user input. For example, when the 3D model apparatus is a roll press apparatus for secondary battery production, the user may adjust EPC by dragging an EPC adjustment dial of the roll press, adjust a roll gap by dragging a main roll, and enlarge or reduce a specific area by touching the specific area of the roll press apparatus. In this case, user action information based on the EPC adjustment dial, the main roll, and the specific area, and the like may be generated.

According to an embodiment, the user condition information is generated based on a user input that changes conditions and/or values of at least part of parameters among a plurality of adjustment parameters included in the facility operating unit 120 and may include information about an amount of change in a condition value to determine the operation of the 3D model apparatus according to the user input. For example, when the 3D model apparatus is a roll press apparatus for secondary battery production, the user may change, for example, a roll gap parameter and a counter-pressure parameter to a specific value through the facility operating unit 120; in this case, user condition information based on the changed value of the roll gap parameter and the counter-pressure parameter may be generated.

According to an embodiment, the button manipulation information is information generated based on a user input of touching at least some of the plurality of buttons included in the main operation panel 130, and may include information for operating of the 3D model apparatus according to the user input. For example, if the 3D model apparatus is a roll press apparatus for secondary battery production, in a roll press operation preparation training, the user may touch a specific button on the main operation panel 130; in this case, the button manipulation information based on the touched button may be generated.

As described above, when the operation of the 3D model apparatus is executed based on the user condition information, the button manipulation information and/or the user action information, the quality determination unit 220 may determine or generate quality information related to the quality of a material produced by the operation of the 3D model apparatus. In other words, when the 3D model apparatus operates (when animations or images are played to operate the 3D model apparatus), the quality information may be determined or generated differently according to a setting value or a condition value of the corresponding 3D model apparatus. In other words, the user may change or adjust the quality of a material produced by a 3D model apparatus by changing adjustment parameters or setting at least part of an area of the corresponding 3D model apparatus using a touch input.

According to an embodiment, the quality determination unit 220 may determine or extract one or more quality parameters for determining the quality of a material produced by the 3D model apparatus, and while the operation of the 3D model apparatus is in execution, a value corresponding to each of one or more quality parameters determined based on the operation of the 3D model apparatus under execution may be calculated. Here, a predetermined, arbitrary algorithm may calculate the value corresponding to the quality parameter. In addition, the quality determination unit 220 may generate quality information related to the quality of a material produced by the 3D model apparatus based on a value corresponding to each of the one or more quality parameters calculated. For example, in a case where the 3D model apparatus is a roll press apparatus for secondary battery production, when a user adjusts the roll gap parameter and/or the counter-pressure parameter, a value corresponding to a thickness of the material (e.g., thickness of at least one of a total thickness, a drive side thickness (e.g., a facility side thickness), an operator side thickness, or a side thickness) may be calculated. In this case, the quality determination unit 220 may generate or output quality information including the calculated thickness.

According to an embodiment, a defect scenario related to a malfunction of the 3D model apparatus may occur during or before the operation of the 3D model apparatus. When a defect scenario occurs as described above, at least part of the setting values, condition values, and quality information of the 3D model apparatus may be changed to lie between an abnormal range based on the defect scenario.

According to an embodiment, the scenario management unit 230 may determine one or more defect scenarios among a plurality of defect scenarios related to a malfunction of the 3D model apparatus and, based on the determined one or more defect scenarios, may change at least one of the operation of the 3D model apparatus or the quality information related to the quality of the material. For example, when the 3D model apparatus is a roll press apparatus, the plurality of defect scenarios may include, for example, a total thickness defect, an operator side thickness defect, a drive side thickness defect, and a side thickness defect. In this case, the scenario management unit 230 may determine a defect scenario by extracting at least one from among the defect scenarios such as the total thickness defect, the operator side thickness defect, the drive side thickness defect, and the side thickness defect, and, according to the extracted or determined defect scenario, may change the adjustment parameter, operation, and quality information of the 3D model apparatus.

According to an embodiment, when a defect scenario occurs, the user may change the adjustment parameter or the settings of the 3D model apparatus to resolve the occurred defect scenario. In this case, the scenario management unit 230 may receive at least one of user action information or user condition information for resolving the determined one or more defect scenarios and correct the operation of the 3D model apparatus changed based on at least one of the received user action information or user condition information. In addition, while the operation of the corrected 3D model apparatus is in execution, the scenario management unit 230 may calculate a value corresponding to each of a plurality of quality parameters related to the quality of a material produced by the 3D model apparatus based on the operation of the 3D model apparatus in execution and may correct the quality information related to the quality of a material produced by the corrected 3D model apparatus based on the value corresponding to each of the plurality of calculated quality parameters.

Then, the scenario management unit 230 may determine whether one or more defect scenarios have been resolved using the corrected quality information. For example, when the quality of a material falls within a predetermined normal range of a spec, the scenario management unit 230 may determine that the defect scenario has been resolved, but the present disclosure is not limited to the specific operation; when the value of each quality parameter included in the quality information lies within the predetermined normal range of the spec or corresponds to a specific value, the scenario management unit 230 may determine that the defect scenario has been resolved. Additionally or alternatively, when a value calculated by providing each quality parameter to an arbitrary algorithm falls within a predetermined normal range, the scenario management unit 230 may determine that the defect scenario has been resolved.

According to an embodiment, a setting value and a condition value of the 3D model apparatus changed to lie within the range of a malfunction by a defect scenario may be determined in advance for each defect scenario, but the present disclosure is not limited to the specific operation. For example, the defect scenario may be generated based on error information generated when actual secondary battery production equipment malfunctions. In other words, when a malfunction occurs in an external device (e.g., actual secondary battery production equipment) related to the 3D model apparatus, the scenario management unit 230 may obtain error information related to the malfunction and, based on the obtained error information, may generate a defect scenario related to the malfunction of the 3D model apparatus. For example, when a malfunction occurs in the coater, which is the previous process of a roll press, the scenario management unit 230 may obtain a value of each adjustment parameter and a setting value of the coater at the time of malfunction as error information. The scenario management unit 230 may generate a defect scenario by changing the obtained value of each adjustment parameter and each setting value of the apparatus to correspond to the 3D model apparatus. Since a defect scenario occurs based on the error information from an actual apparatus using the configuration above, the simulation apparatus 100 may effectively generate training contents optimized for actual work environments.

According to an embodiment, the test execution unit 240 may determine whether one or more defect scenarios have been resolved using the corrected quality information; when it is determined that one or more defect scenarios have been resolved, the test execution unit 240 may calculate a progress time and a loss value of one or more defect scenarios while one or more defect scenarios are in progress. For example, the loss value may include, for example, a coating loss value and a material loss value and may be calculated through a predetermined, arbitrary algorithm based on a user's response time, a user input value, and the like. In addition, the test execution unit 240 may generate operational capability information of the 3D model apparatus for a user account based on the calculated progress time and loss value. Here, the user account may refer to an account of a worker who uses the simulation apparatus 100, and the operational capability information represents the work skill level of the user, which may include a work speed, degree of proximity to a target value, and an evaluation score. Additionally, when the corresponding user solves all predetermined types of defect scenarios, the test execution unit 240 may determine whether the user passes a simulation training based on the operational capability information for each defect scenario.

The user management unit 250 may perform management such as registration, modification, and deletion of a user account related to a user who uses the simulation apparatus 100. According to an embodiment, the user may use the simulation apparatus 100 using the user's registered user account. In this case, the user management unit 250 may store and manage information on whether each defect scenario has been resolved and operational capability information for dealing with each defect scenario in an arbitrary database for each user account. Using the information stored by the user management unit 250, the scenario management unit 230 may extract information related to a specific user account stored in the database and extract or determine at least one scenario among a plurality of defect scenarios based on the extracted information. For example, the scenario management unit 230 may extract only a defect scenario in which the working speed is lower than an average working speed based on the information related to the user account or provide the extracted defect scenario to the corresponding user, but the present disclosure is not limited to the specific operation; the defect scenario may be extracted or determined by another arbitrary criterion or a combination of arbitrary criteria.

In FIG. 2, it is assumed that functional configurations included in the simulation apparatus 100 are different from each other; however, the assumption is intended only to help understand the disclosure, and one computing device may perform two or more functions. In addition, the simulation apparatus 100 of FIG. 2 assumes to be distinguished from the facility operating unit 120, the main operation panel 130, the apparatus operating unit 140 and the quality checking unit 150; however, the present disclosure is not limited to the assumption, and the facility operating unit 120, the main operation panel 130, the apparatus operating unit 140, and the quality checking unit 150 may be included in the simulation apparatus 100. Using the configuration above, the simulation apparatus 100 may generate a defect scenario having various values related to the malfunction of the secondary battery production equipment and provide the generated scenarios to the user; accordingly, the user may be trained in a method of resolving a malfunction situation that may occur in an actual apparatus without help from others and effectively learn how to respond to each situation.

Figure 3:
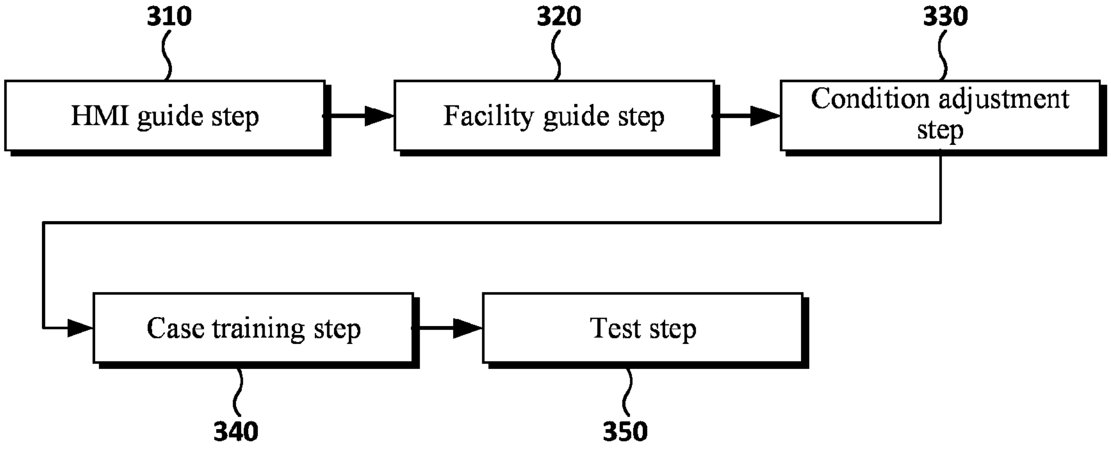
FIG. 3 is a block diagram illustrating an example in which a simulation apparatus operates according to an embodiment of the present disclosure.

FIG. 3 is a block diagram illustrating an example in which a simulation apparatus 100 operates according to an embodiment of the present disclosure. As illustrated in the figure, the simulation apparatus (100 in FIG. 1) may operate through processes such as a HMI (Human-Machine Interface) guide step 310, a facility guide step 320, a condition adjustment step 330, a case training step 340, and a test step 350. In other words, the user may be trained in a method of operating secondary battery production equipment through the steps 310, 320, 330, 340, 350.

The HMI guide step 310 may be a step of learning types of various adjustment parameters included in the facility operating unit and a method of manipulating adjustment parameters. For example, a work specification indicating, for example, the types of adjustment parameters and a method of manipulating adjustment parameters may be displayed or output on the facility operating unit, the apparatus operating unit, and the like. Additionally, a portion of the screen may be turned on or activated so that the user may perform a task corresponding to the work specification. In this case, the user may be trained in how to use the facility operating unit by manipulating a condition and/or a value of an arbitrary adjustment parameter corresponding to the work specification. When the user touches a button for a predetermined time according to the work specification or enters a correct value corresponding to an arbitrary parameter, the next step may be performed, or a button that leads to the next step (e.g., NEXT button) may be displayed or activated.

The facility guide step 320 may be a step of describing secondary battery production processes or equipment. When the 3D model apparatus is a roll press apparatus, the facility guide step 320 may include, for example, description of the roll press process, description of an unwinder and its components (chuck, sensor, EPC, etc.), description of a rolling roll and its components (upper, lower, counter-pressure cylinder, roll cleaner, cooling, safety sensor, etc.), description of the crown principle of the rolling roll, description of principle and monitoring of an automatic thickness measuring machine, description of a rewinder and its components (chuck, touch roll, etc.), description of a manual thickness measuring machine, and description of the safety item.

The condition adjustment step 330 may be a step in which the user learns how to set initial values of the facility operating unit, the apparatus operating unit, and the quality checking unit before operating the secondary battery production apparatus. For example, a work specification indicating initial values of the facility operating unit, the apparatus operating unit, and the quality checking unit may be displayed or output on the facility operating unit, the apparatus operating unit and the like. Additionally, a partial area of the screen may be turned on or activated so that the user may perform a task corresponding to the work specification. In this case, the user may learn how to set the initial values by checking the setting values (e.g., EPC, tension, roll gap, counter pressure, etc.) of the 3D model apparatus corresponding to the work specification with a touch input. When the user completes setting the initial value according to the work specification, it may proceed to the next step, or a button (e.g., a NEXT button) for proceeding to the next step may be displayed or activated.

The condition adjustment step 330 may be a training scenario execution step based on the operating process of the secondary battery production apparatus. For example, in the case of a roll press, it may be a process of training the work specification checking, the EPC adjustment, the tension adjustment, the roll gap adjustment, the counter-pressure adjustment, and the quality checking. According to the training scenario of the equipment, the 3D model apparatus may be operated, and a guide image may be displayed or output on the type of adjustment parameter, the value of the adjustment parameter, the 3D model apparatus, and the button to be manipulated for checking and adjustment. The user may learn the operating process of the secondary battery production apparatus based on the displayed information.

The case training step 340 may be a step in which a user learns how to check and take measures against defects that occur during operation of the secondary battery production apparatus. For example, in the case of a roll press, a total thickness defect, an operator side thickness defect, a drive side thickness defect, a side thickness defect, and a complex defect in which two or more types of thickness defects occur simultaneously may occur; as the defect occurs, the types of adjustment parameters, the values of the adjustment parameters, the setting values of the 3D model device, and the like to be manipulated to solve the defect may be displayed or output. The user may process the defects based on the displayed information and learn how to solve the defects.

The case training step 340 may be a step in which a user repeatedly processes or resolves each defect scenario or a combination of the plurality of defect scenarios related to the secondary battery production apparatus to master a defect-solving method. For example, the user may directly select one defect scenario among a plurality of defect scenarios and be trained in the selected scenario, but the present disclosure is not limited to the operation; the user may be trained in a defect scenario determined randomly by the simulation apparatus. In this case, in the case training step 340, guide information including condition information and action information required to solve each defect according to the defect scenario may be displayed or output. Here, when the user manipulates a specific adjustment parameter or changes a set value of the 3D model apparatus, the operation of the 3D model apparatus and the quality of a material associated with the 3D model apparatus may be changed in real time. By checking the changed quality, the user may resolve the defect through repeated training and improve the skill in coping with the defect.

The test step 350 may be a step of evaluating the operational capability of a user by testing the process through which the user resolves a defect scenario. For example, when a user resolves each defect scenario, the operational capability of the user may be measured or evaluated based on, for example, a progress time and a loss value for each defect scenario. The user may additionally learn or be trained for an incomplete defect scenario by checking the operational capability and whether the user has passed the test.

Although FIG. 3 assumes that each step is sequentially performed, the present disclosure is not limited to the assumption, and some of the steps may be omitted. In addition, the order of performing the steps may be changed and may be repeated. For example, after the test step 350, the case training step 340 may be performed again. Based on the configuration, the user may easily learn how to operate the secondary battery production apparatus through the simulation progressed step by step according to the user's task skill.

Figure 4:
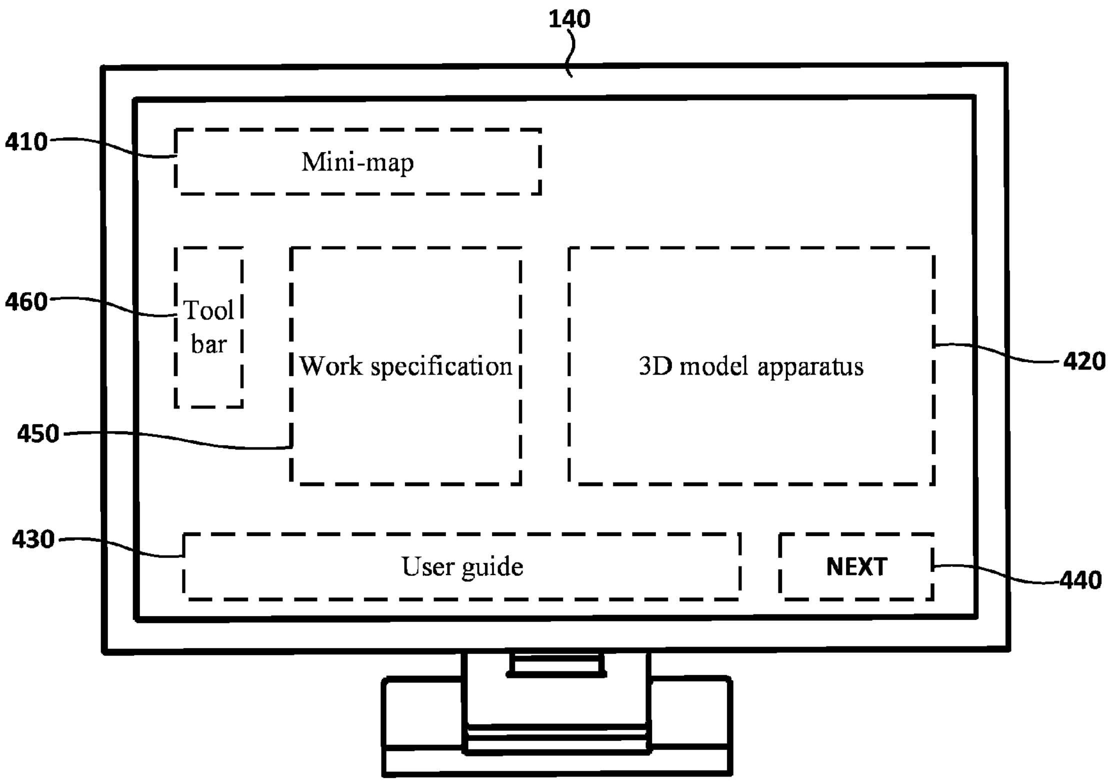
FIG. 4 illustrates an example of a display screen displayed or output on an apparatus operating unit according to an embodiment of the present disclosure.

FIG. 4 illustrates an example of a display screen displayed or output on an apparatus operating unit 140 according to an embodiment of the present disclosure. As illustrated in the figure, the apparatus operating unit 140 may display or output text, an image, and a video including a mini-map 410, a 3D model apparatus 420, a user guide 430, a NEXT button 440, a work specification 450, and a tool bar 460 on the display screen. FIG. 4 assumes that the mini-map 410, the 3D model apparatus 420, the user guide 430, the NEXT button 440, the work specification 450, and the tool bar 460 are displayed in a specific area on the display screen, but the present disclosure is not limited to the assumption; each of the text, image, and video may be displayed in an arbitrary area of the display screen.

The mini-map 410 briefly displays the entire roll press apparatus for secondary battery production, and the approximate position of the area displayed on the 3D model apparatus 420 out of the entire roll press apparatus is displayed as a rectangular box. When the apparatus displayed on the 3D model apparatus 420 is changed, the position and size of the rectangular box displayed on the mini-map 410 may also be changed in real-time. For example, the mini-map 410 may perform the function of a position guide map of the roll press apparatus.

The 3D model apparatus 420 may be a 3D image or video that implements the secondary battery production equipment in a 3D form. For example, the 3D model apparatus 420 may operate based on the user condition information and/or user action information input from a user.

The user guide 430 may be the information for guiding a user's next action, which includes information necessary to operate the 3D model apparatus 420, condition information and action information required to solve a defect scenario, and so on. In other words, even when the user does not know how to operate the simulation apparatus, the user may be trained in a method of operating the simulation apparatus and a method of dealing with a defect using the user guide 430.

When the condition value or setting value of the 3D model apparatus is determined or the 3D model apparatus 420 is operated using the displayed user guide 430, the corresponding step is resolved, and the NEXT button 440 for proceeding to the next step may be activated. The user may select the activated NEXT button 440 through, for example, a touch input to perform training corresponding to the next step.

The work specification 450 which is a document containing initial setting values and condition values of the 3D model apparatus 420 may be predetermined or generated by a particular algorithm. For example, the simulation apparatus may receive and provide the contents of the work specification used to operate actual secondary battery production equipment or generate a new work specification by calculating the initial setting values and condition values of the 3D model apparatus 420 based on a plurality of input work specifications. If the 3D model apparatus is a roll press apparatus, the work specification may include spec information such as anode/cathode to be produced, PJT name, version, tension (unwinder, outfeed, rewinder), and the like. The work specification 450 may be continuously displayed on the apparatus operating unit or may be displayed in a pop-up form on the 3D model apparatus by a user's manipulation.

The tool bar 460 displays various tool icons for operating the 3D model apparatus. If the 3D model apparatus is a roll press apparatus, tool icons may include, for example, work specification, rulers, knives, tapes, and non-woven fabrics. When the user selects the work specification icon, as described above, a work specification indicating spec information about materials produced by the 3D model apparatus may be displayed in a pop-up form. The user may input the adjustment parameters of the facility operating unit based on the spec information indicated in the work specification.

Figure 5:
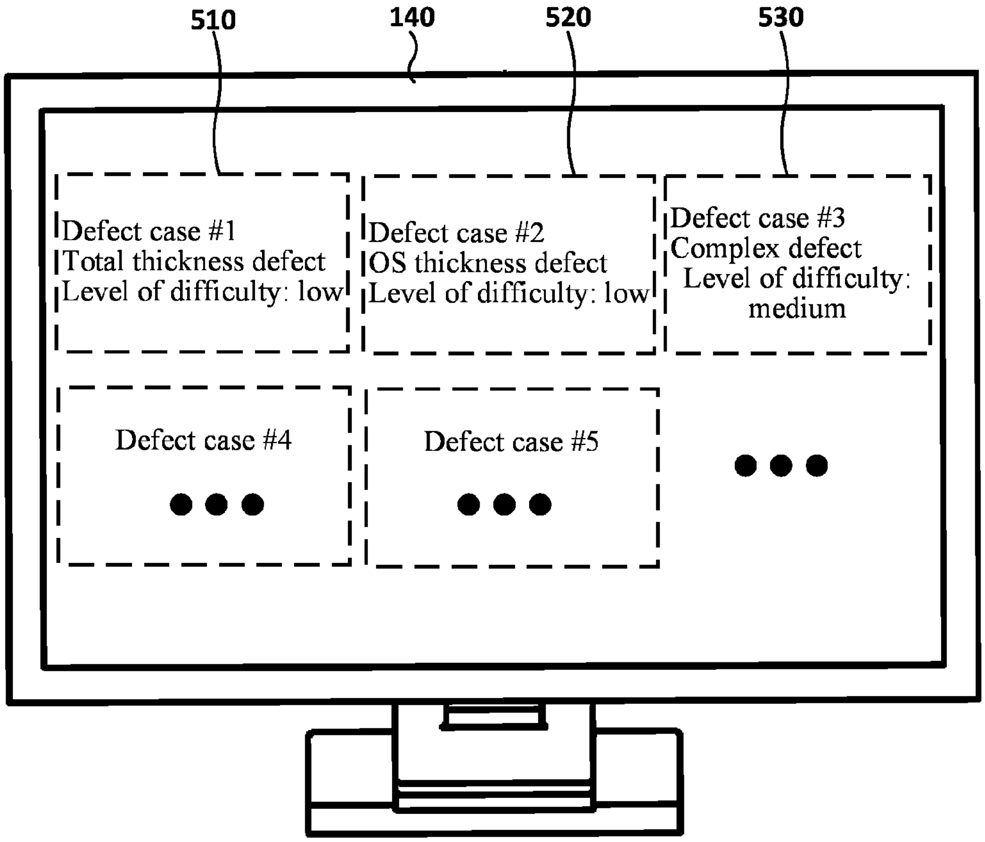
FIG. 5 illustrates an example of a display screen displayed or output on an apparatus operating unit according to another embodiment of the present disclosure.

FIG. 5 illustrates an example of a display screen displayed or output on an apparatus operating unit 140 according to another embodiment of the present disclosure. As illustrated in the figure, the apparatus operating unit 140 may display or output text, an image, or a video including a plurality of defect scenarios 510, 520, 530 on the display screen. FIG. 5 assumes that a first defect scenario 510, a second defect scenario 520, and a third defect scenario 530 are displayed in specific areas on the display screen, but the present disclosure is not limited to the assumption; each text, image, or video may be displayed in any position on the display screen.

According to an embodiment, each defect scenario may include details and the level of difficulty of the defect scenario. For example, the first defect scenario 510 may be a total thickness defect with a low level of difficulty, the second defect scenario 520 may be an OS thickness defect with a low level of difficulty, and the third defect scenario 530 may be a complex defect with a medium level of difficulty. A user may select at least part of the plurality of defect scenarios 510, 520, 530 displayed on the display screen through a touch input to perform training based on the selected defect scenario.

Additionally or alternatively, one defect scenario among the plurality of defect scenarios 510, 520, 530 may be determined by a predetermined algorithm. For example, through a user account (or information related to the user account) of a user performing training, the simulation apparatus may determine a defect scenario for which the user is not fully skilled or a combination of defect scenarios. Here, the user's work skill level may be calculated or determined as a test result for each defect scenario, but the present disclosure is not limited to the specific scheme. Based on the configuration, the user may easily identify and process a defect scenario for which the user lacks training; thus, the user may be trained only in the defect scenario for which the user has low work skills.

Figure 6:
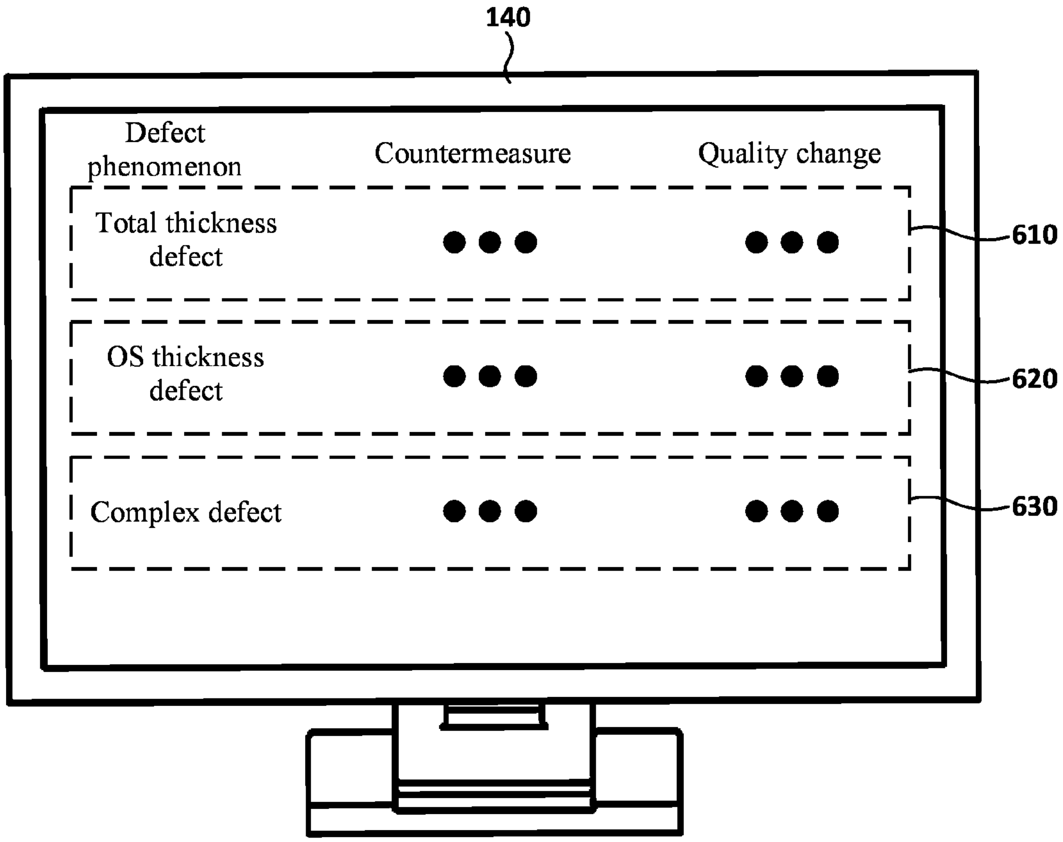
FIG. 6 illustrates an example of a display screen displayed or output on an apparatus operating unit according to yet another embodiment of the present disclosure.

FIG. 6 illustrates an example of a display screen displayed or output on an apparatus operating unit 140 according to yet another embodiment of the present disclosure. As illustrated, the apparatus operating unit 140 may display or output, on a display screen, text, images, videos, and the like related to guide information 610, 620, 630 including condition information and action information required to solve each defect. It is illustrated in FIG. 6 that the first guide information 610, the second guide information 620, the third guide information 630, and the like are displayed in a specific area on the display screen, but the present disclosure is not limited thereto, and each text, image, video, etc. may be displayed on an arbitrary area of the display screen.

According to an embodiment, the guide information 610, 620, and 630 may include, for example, a defect phenomenon, a countermeasure, and a quality change amount according to a change in setting values and/or condition values of the 3D model apparatus. For example, the first guide information 610 may include a quality change, a countermeasure, and the like related to the total thickness defect, the second guide information 620 may include a quality change, a countermeasure, and the like related to the OS thickness defect, and the third guide information 630 may include a quality change, a countermeasure, and the like related to the complex defect. The user may check the defect phenomenon and the countermeasure corresponding to each defect phenomenon, manipulate the condition and/or value of the adjustment parameter, or adjust the setting value of the 3D model apparatus to perform training so that materials with quality within the normal range may be produced.

It is illustrated in FIG. 6 that the guide information 610, 620, and 630 are displayed or output on the apparatus operating unit 140, but the present disclosure is not limited thereto, and the guide information may be displayed on a separate display device.

Figure 7:
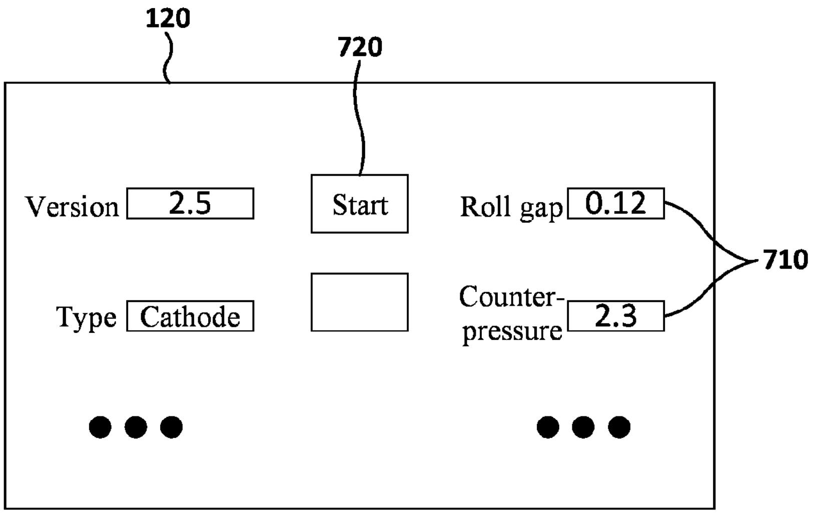
FIG. 7 illustrates an example of a display screen displayed or output on a facility operating unit related to 3D roll pressing according to an embodiment of the present disclosure.

FIG. 7 illustrates an example of a display screen displayed or output on a facility operating unit related to 3D roll pressing according to an embodiment of the present disclosure. According to an embodiment, the roll press may refer to an apparatus for pressing an electrode coated in a coating process for secondary battery production to a certain thickness by allowing the electrode to pass between two rotating upper and lower rolls. The roll press may include a plurality of rolling rolls (e.g., rolling rollers) and the like. In the roll pressing process performed by such a roll press, it may be essential to uniformly roll to a thickness determined in the spec in the work specification in order to produce a material with fair quality. The facility operating unit 120 may include a plurality of areas 710 for inputting text such as material information (electrode type, version information, etc.) and spec information (roll gap, counter-pressure, etc.) recorded in the work specification sheet, and a plurality of areas 710 displaying button images to be touched while operating the roll press. In the facility operating unit 120, a plurality of screens having separate layouts may be overlapped and additionally displayed while the simulation apparatus of the present disclosure is operating. When the user clicks the button area, the color of the corresponding button may be changed or a new screen may be popped up and displayed.

According to an embodiment, the plurality of adjustment parameters for determining the operation of the 3D roll press apparatus may include EPC, tension, roll gap, counter-pressure, and the like. Here, the EPC may be a parameter used to control a position of the rolling rolls, the tension may be a parameter used to control a tension of a material passing through the rolling rolls, the roll gap may be a parameter used to control a gap between the upper and lower rolls, and the counter pressure may be a parameter used to adjust a pressure applied to the material by the rolling roll.

Figure 8:
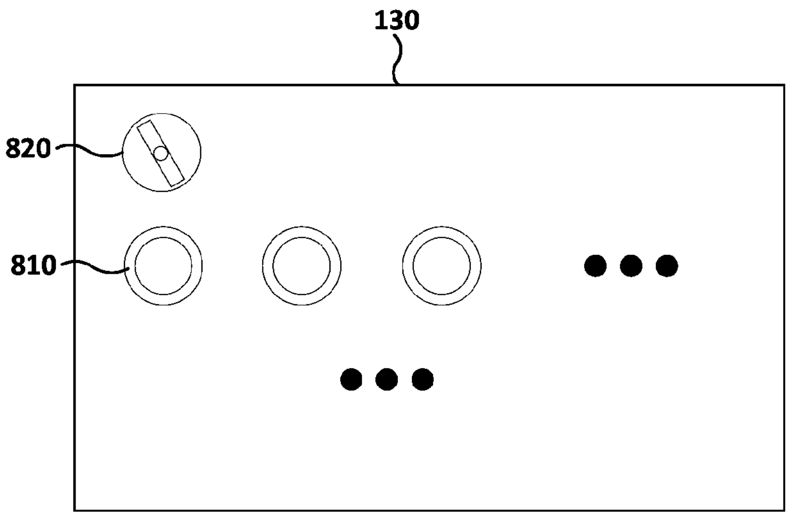
FIG. 8 illustrates an example of a display screen displayed or output on a main operation panel related to 3D roll pressing according to an embodiment of the present disclosure.

FIG. 8 illustrates an example of a display screen displayed or output on a main operation panel related to 3D roll pressing according to an embodiment of the present disclosure. According to an embodiment, the main operation panel 130 for operating the roll press may include a plurality of button images 810. Button names may be displayed on each of the plurality of button images. When the user touches a button image with a certain button name, the color, shape, or image of part of the button image may be changed during the touch so that the user may recognize that the state of the button state is changing. When the user touches the button image for a predetermined period of time or longer, the color, shape, or image of the corresponding button may be changed so that the user may recognize that the state change of the button has been completed. In addition, the main operation panel 130 may include at least one lever image. A lever name may be displayed near the lever image, and when the user drags the lever image, the lever may be changed to rotate in the direction the user drags.

Figure 9:
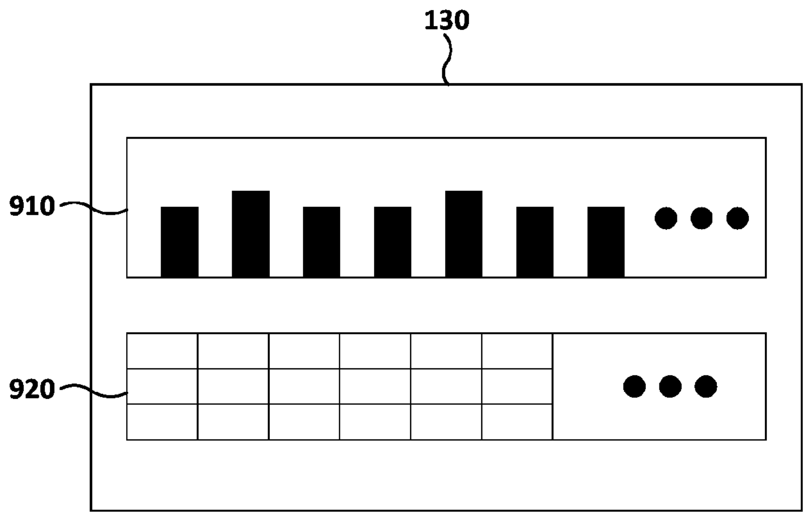
FIG. 9 illustrates an example of a display screen displayed or output on a quality checking unit related to 3D roll pressing according to an embodiment of the present disclosure.

FIG. 9 illustrates an example of a display screen displayed or output on a quality checking unit 150 related to 3D roll pressing according to an embodiment of the present disclosure. According to an embodiment, quality information related to the quality of the material produced by the 3D roll press may be displayed or output on the quality checking unit 150. The quality checking unit 150 may include a graph area 910 displaying quality information related to the quality of the material (e.g., thickness information measured at a plurality of locations of the material being produced) in a graph and a table area 920 displaying quality information related to the quality of the material in numerical values.

For example, the simulation apparatus (100 in FIG. 1) determines one or more quality parameters for determining the quality of the material produced by the 3D roll press, and while the operation of the 3D roll press is being executed, a value corresponding to each of the one or more quality parameters determined based on the operation of the 3D roll press being executed may be calculated. Then, the simulation apparatus may generate and output quality information related to the quality of the material produced by the 3D roll press based on the calculated values corresponding to each of the one or more quality parameters. In the illustrated example, the quality checking unit may include quality information (or quality parameters) for checking various thickness defects and the like. This thickness defect may be determined by the image, video, animation, and the like of the 3D roll press displayed on the apparatus operating unit 140, or may be determined by setting values of adjustment parameters displayed on the facility operating unit 120. In addition, in response to the change of quality parameter in the quality checking unit 150, the image, video, animation, and the like of the 3D roll press of the apparatus operating unit 140 may be changed, or the adjustment parameter value displayed on the facility operating unit 120 may be changed.

According to an embodiment, when a set value of the roll gap or a set value of the tension of the facility operating unit 120 is changed by the user, the value of the quality parameter of the quality checking unit 150 may be changed or adjusted. The user may check the operation and quality information of the 3D roll press apparatus that changes in real time by adjusting the plurality of adjustment parameters or manipulating the 3D roll press with a touch input or a drag input.

Figure 10:
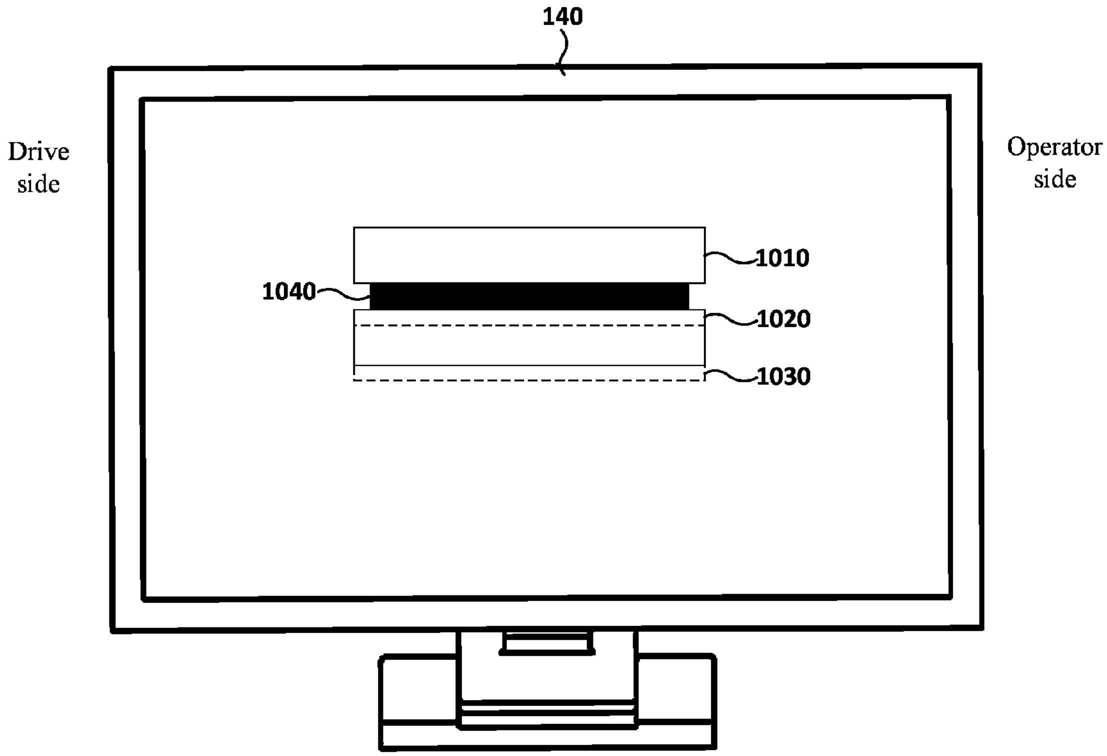
FIG. 10 illustrates an example in which a total thickness defect scenario has occurred according to an embodiment of the present disclosure.

FIG. 10 illustrates an example in which a total thickness defect scenario has occurred according to an embodiment of the present disclosure. The simulation apparatus (100 in FIG. 1) may determine one or more defect scenarios among a plurality of defect scenarios related to malfunctions of the 3D roll press and change at least one of the operation of the 3D roll press or the quality information related to the quality of the material based on the determined one or more defect scenarios. Here, the plurality of defect scenarios may include a total thickness defect scenario. For example, the total thickness defect scenario may refer to a scenario in which the total thickness of the material deviates from an upper or lower limit of the specification because the total thickness of the material is greater than the upper limit or less than the lower limit of the specification set in the work specification.

According to an embodiment, when the determined one or more defect scenarios include the total thickness defect scenario, the simulation apparatus may change an upper roll 1010 and/or a lower roll 1020 of the rolling roll of the 3D roll press included in the apparatus operating unit 140 to a predetermined area (e.g., image, video, animation and the like such as a dot, line, or plane representing the upper roll or the lower roll). In other words, when the total thickness defect scenario occurs, the image of the lower roll 1020 may move to a predetermined area 1030 in animation such that a roll gap between the upper roll 1010 and the lower roll 1020 may be changed. When the roll gap between the upper roll and the lower roll is changed in such a manner, a thickness of a material 1040 passing between the upper and lower rolls may be changed.

When such a total thickness defect scenario has occurred, the user may touch or drag a specific region of the 3D roll press displayed on the apparatus operating unit 140 to respond to the total thickness defect scenario. In addition, the user may change the adjustment parameter (e.g., total roll gap) related to the total thickness adjustment of the facility operating unit 120 to respond to the total thickness defect scenario. In other words, as the simulation apparatus receives from the user the user action information of touching or dragging at least a partial area corresponding to the lower roll of the 3D roll press, or receives from the facility operating unit the user condition information of changing the setting value of the adjustment parameter corresponding to the total roll gap, the simulation apparatus may normally correct the material that has been changed to be defective.

Then, the simulation apparatus may determine whether the total thickness defect scenario has been resolved based on at least a partial area of the corrected material. For example, when the user action information is generated based on a touch input, a drag input, or the like on a predetermined area in a predetermined order, the simulation apparatus may determine that the total thickness defect scenario has been resolved. In addition, when the user condition information is changed to a predetermined value, the simulation apparatus may determine that the total thickness defect scenario has been resolved. If it is determined that the defect scenario has been resolved, the predetermined area representing the total thickness defect may be removed from the image, video and/or animation of the 3D roll press, and the quality parameter of the material displayed on the quality checking unit 150 may be normally corrected and changed.

It is illustrated in FIG. 10 that the image, video and/or animation representing part of the 3D roll press is displayed on the apparatus operating unit 140, but the present disclosure is not limited thereto, and the apparatus operating unit 140 may include an image, a video, and/or an animation of the same shape as the actual roll press. With this configuration, the user may effectively learn in advance how to respond to problems that may occur in the roll pressing process, and the simulation apparatus may effectively determine whether or not the problem has been resolved based on the user's input or action received.

Figure 11:
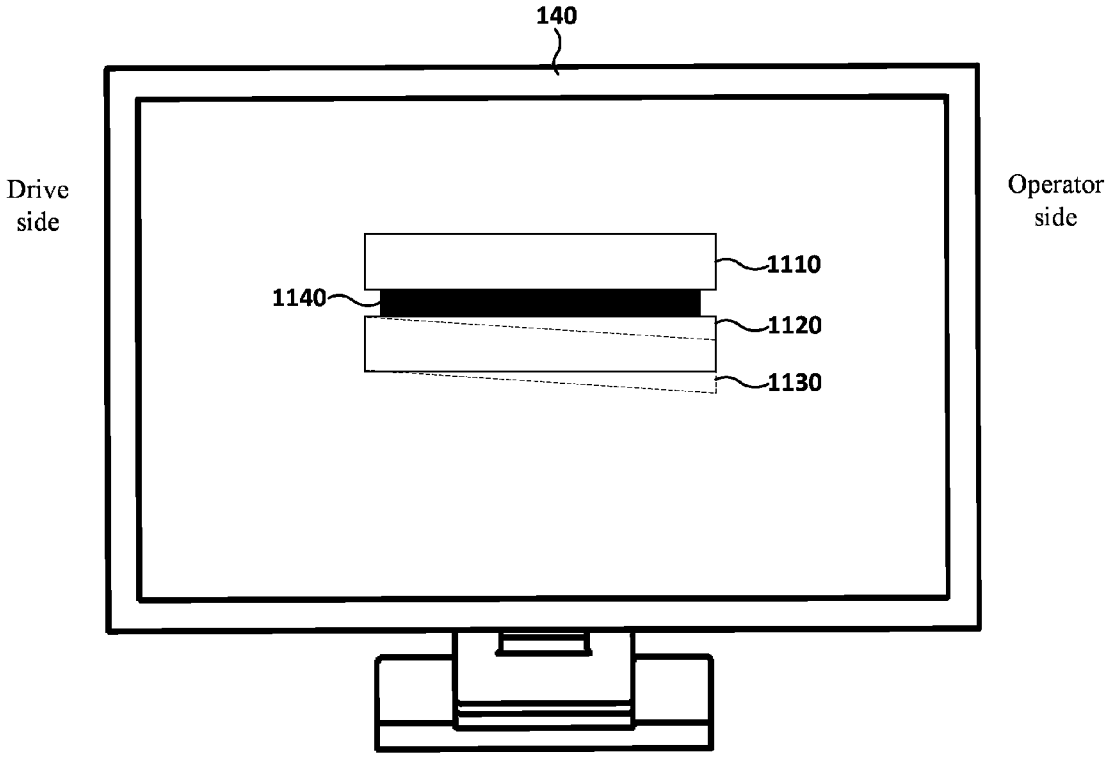
FIG. 11 illustrates an example in which an operator side (OS) thickness defect scenario has occurred according to an embodiment of the present disclosure.

FIG. 11 illustrates an example in which an operator side (OS) thickness defect scenario has occurred according to an embodiment of the present disclosure. The simulation apparatus (100 in FIG. 1) may determine one or more defect scenarios among a plurality of defect scenarios related to malfunctions of the 3D roll press, and change at least one of the operation of the 3D roll press or quality information related to the quality of the material based on the determined one or more defect scenarios. Here, the plurality of defect scenarios may include an operator side (OS) thickness defect scenario. For example, the operator side thickness defect scenario may refer to a scenario in which the thickness of the material in the operator direction deviates from an upper or lower limit of the specification because the operator side thickness of the material is greater than the upper limit or less than the lower limit of the specification set in the work specification.

According to an embodiment, when the determined one or more defect scenarios include the operator side thickness defect scenario, the simulation apparatus may change an upper roll 1110 and/or a lower roll 1120 of the rolling roll of the 3D roll press included in the apparatus operating unit 140 to a predetermined area (e.g., image, video, animation and the like such as a dot, line, or plane representing the upper roll or the lower roll). In other words, when the operator side thickness defect scenario occurs, the image of the lower roll 1120 may move to a predetermined area 1130 in animation such that a roll gap between the upper roll 1110 and the lower roll 1120 may be changed. When the roll gap between the upper roll and the lower roll is changed in such a manner, the operator side thickness of a material 1140 passing between the upper and lower rolls may be changed.

When such an operator side thickness defect scenario has occurred, the user may touch or drag a specific region of the 3D roll press displayed on the apparatus operating unit 140 to respond to the operator side thickness defect scenario. In addition, the user may change the adjustment parameter (e.g., roll gap in the operator direction) related to the operator side thickness adjustment of the facility operating unit 120 to respond to the operator side thickness defect scenario. In other words, as the simulation apparatus receives from the user the user action information of touching or dragging at least a partial area corresponding to the lower roll of the 3D roll press, or receives from the facility operating unit the user condition information of changing the setting value of the adjustment parameter corresponding to the roll gap in the operator direction, the simulation apparatus may normally correct the material that has been changed to be defective.

Then, the simulation apparatus may determine whether the operator side thickness defect scenario has been resolved based on at least a partial area of the corrected material. For example, when the user action information is generated based on a touch input, a drag input, or the like on a predetermined area in a predetermined order, the simulation apparatus may determine that the operator side thickness defect scenario has been resolved. In addition, when the user condition information is changed to a predetermined value, the simulation apparatus may determine that the operator side thickness defect scenario has been resolved. If it is determined that the defect scenario has been resolved, the predetermined area representing the operator side thickness defect may be removed from the image, video and/or animation of the 3D roll press, and the quality parameter of the material displayed on the quality checking unit 150 may be normally corrected and changed.

It is illustrated in FIG. 11 that the image, video and/or animation representing part of the 3D roll press is displayed on the apparatus operating unit 140, but the present disclosure is not limited thereto, and the apparatus operating unit 140 may include an image, a video, and/or an animation of the same shape as the actual roll press. With this configuration, the user may effectively learn in advance how to respond to problems that may occur in the roll pressing process, and the simulation apparatus may effectively determine whether or not the problem has been resolved based on the user's input or action received.

Figure 12:
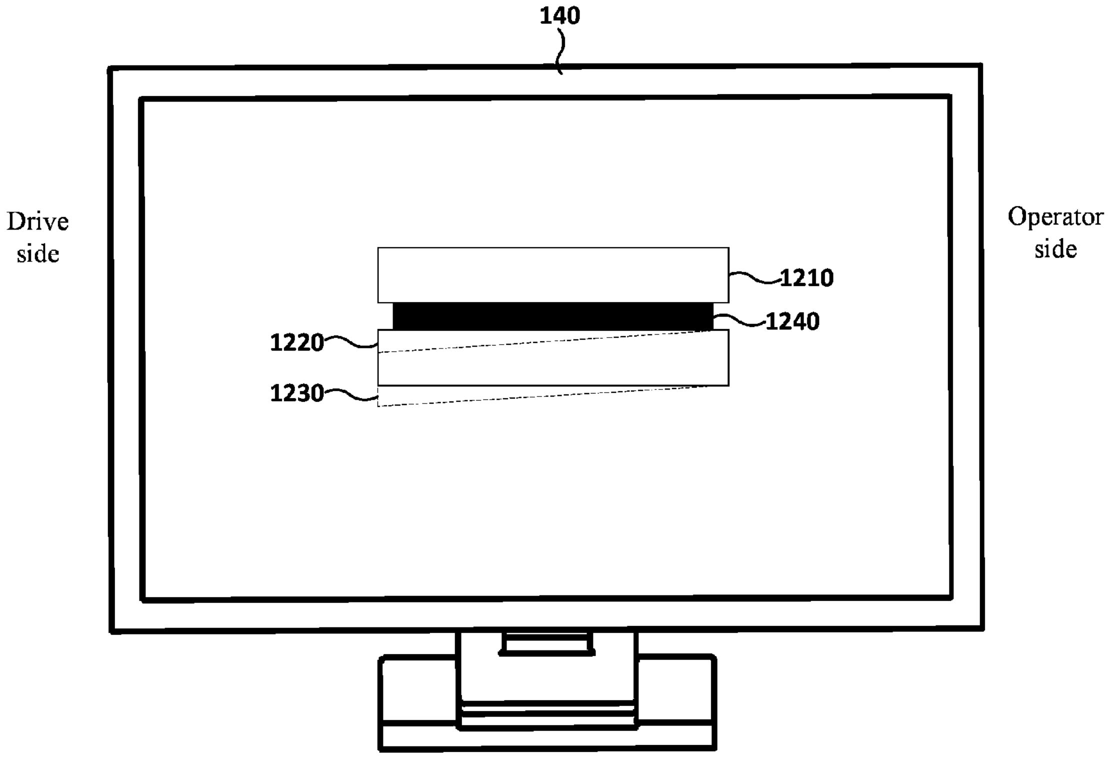
FIG. 12 illustrates an example in which a drive side (DS) thickness defect scenario has occurred according to an embodiment of the present disclosure.

FIG. 12 illustrates an example in which a drive side (DS) thickness defect scenario has occurred according to an embodiment of the present disclosure. The simulation apparatus (100 in FIG. 1) may determine one or more defect scenarios among a plurality of defect scenarios related to malfunctions of the 3D roll press, and change at least one of the operation of the 3D roll press or quality information related to the quality of the material based on the determined one or more defect scenarios. Here, the plurality of defect scenarios may include a drive side (DS) thickness defect scenario. For example, the drive side thickness defect scenario may refer to a scenario in which the thickness of the material in the drive direction deviates from an upper or lower limit of the specification because the drive side thickness of the material is greater than the upper limit or less than the lower limit of the specification set in the work specification.

According to an embodiment, when the determined one or more defect scenarios include the drive side thickness defect scenario, the simulation apparatus may change an upper roll 1210 and/or a lower roll 1220 of the rolling roll of the 3D roll press included in the apparatus operating unit 140 to a predetermined area (e.g., image, video, animation and the like such as a dot, line, or plane representing the upper roll or the lower roll). In other words, when the drive side thickness defect scenario occurs, the image of the lower roll 1220 may move to a predetermined area 1230 in animation such that a roll gap between the upper roll 1210 and the lower roll 1220 may be changed. When the roll gap between the upper roll and the lower roll is changed in such a manner, the drive side thickness of a material 1240 passing between the upper and lower rolls may be changed.

When such a drive side thickness defect scenario has occurred, the user may touch or drag a specific region of the 3D roll press displayed on the apparatus operating unit 140 to respond to the drive side thickness defect scenario. In addition, the user may change the adjustment parameter (e.g., roll gap in the drive direction) related to the drive side thickness adjustment of the facility operating unit 120 to respond to the drive side thickness defect scenario. In other words, as the simulation apparatus receives from the user the user action information of touching or dragging at least a partial area corresponding to the lower roll of the 3D roll press, or receives from the facility operating unit the user condition information of changing the setting value of the adjustment parameter corresponding to the roll gap in the drive direction, the simulation apparatus may normally correct the material that has been changed to be defective.

Then, the simulation apparatus may determine whether the drive side thickness defect scenario has been resolved based on at least a partial area of the corrected material. For example, when the user action information is generated based on a touch input, a drag input, or the like on a predetermined area in a predetermined order, the simulation apparatus may determine that the drive side thickness defect scenario has been resolved. In addition, when the user condition information is changed to a predetermined value, the simulation apparatus may determine that the drive side thickness defect scenario has been resolved. If it is determined that the defect scenario has been resolved, the predetermined area representing the drive side thickness defect may be removed from the image, video and/or animation of the 3D roll press, and the quality parameter of the material displayed on the quality checking unit 150 may be normally corrected and changed.

It is illustrated in FIG. 12 that the image, video and/or animation representing part of the 3D roll press is displayed on the apparatus operating unit 140, but the present disclosure is not limited thereto, and the apparatus operating unit 140 may include an image, a video, and/or an animation of the same shape as the actual roll press. With this configuration, the user may effectively learn in advance how to respond to problems that may occur in the roll pressing process, and the simulation apparatus may effectively determine whether or not the problem has been resolved based on the user's input or action received.

Figure 13:
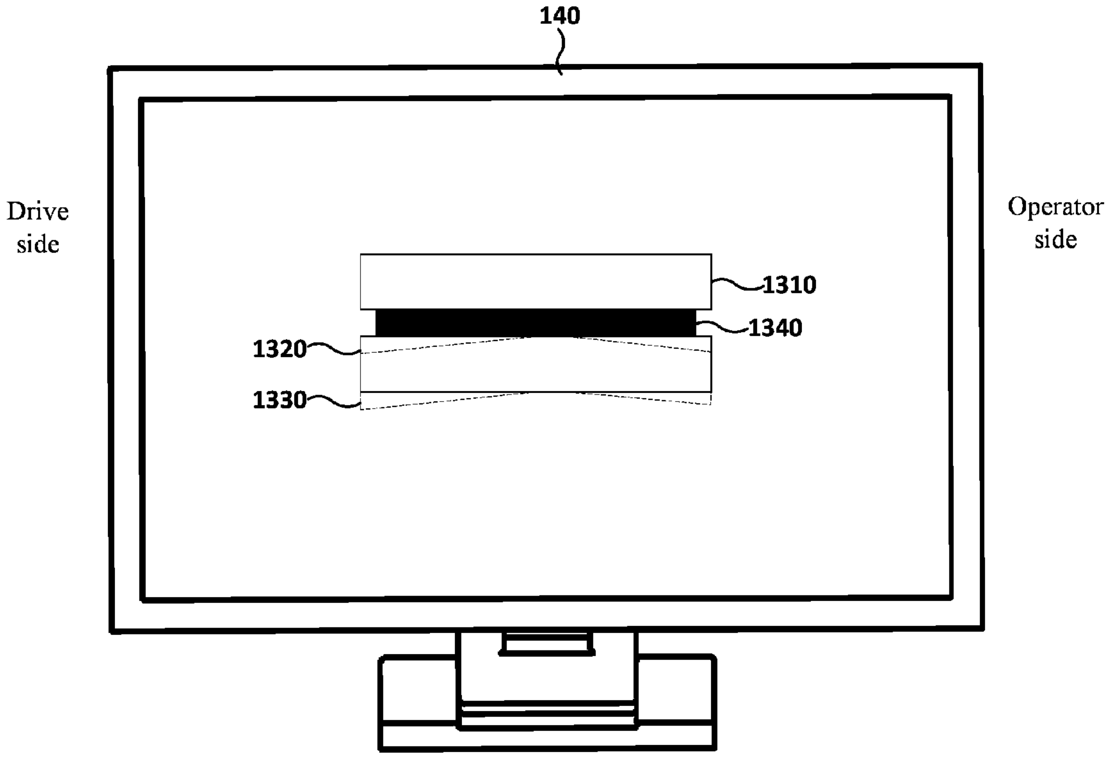
FIG. 13 illustrates an example in which a side thickness defect scenario has occurred according to an embodiment of the present disclosure.

FIG. 13 illustrates an example in which a side thickness defect scenario has occurred according to an embodiment of the present disclosure. The simulation apparatus (100 in FIG. 1) may determine one or more defect scenarios among a plurality of defect scenarios related to malfunctions of the 3D roll press, and change at least one of the operation of the 3D roll press or quality information related to the quality of the material based on the determined one or more defect scenarios. Here, the plurality of defect scenarios may include a side thickness defect scenario. For example, the side thickness defect scenario may refer to a scenario in which the side thickness of the material deviates from an upper or lower limit of the specification because the side thickness of the material is greater than the upper limit or less than the lower limit of the specification set in the work specification.

According to an embodiment, when the determined one or more defect scenarios include the side thickness defect scenario, the simulation apparatus may change an upper roll 1310 and/or a lower roll 1320 of the rolling roll of the 3D roll press included in the apparatus operating unit 140 to a predetermined area (e.g., image, video, animation and the like such as a dot, line, or plane representing the upper roll or the lower roll). In other words, when the side thickness defect scenario occurs, the image of the lower roll 1320 may move to a predetermined area 1330 in animation such that a roll gap between the upper roll 1310 and the lower roll 1320 may be changed. When the roll gap between the upper roll and the lower roll is changed in such a manner, the side thickness of a material 1340 passing between the upper and lower rolls may be changed.

When such a side thickness defect scenario has occurred, the user may touch or drag a specific region of the 3D roll press displayed on the apparatus operating unit 140 to respond to the side thickness defect scenario. In addition, the user may change the adjustment parameter (e.g., counter pressure) related to the side thickness adjustment of the facility operating unit 130 to respond to the side thickness defect scenario. In other words, as the simulation apparatus receives from the user the user action information of touching or dragging at least a partial area corresponding to the lower roll of the 3D roll press, or receives from the facility operating unit the user condition information of changing the setting value of the adjustment parameter corresponding to the counter pressure, the simulation apparatus may normally correct the material that has been changed to be defective.

Then, the simulation apparatus may determine whether the side thickness defect scenario has been resolved based on at least a partial area of the corrected material. For example, when the user action information is generated based on a touch input, a drag input, or the like on a predetermined area in a predetermined order, the simulation apparatus may determine that the side thickness defect scenario has been resolved. In addition, when the user condition information is changed to a predetermined value, the simulation apparatus may determine that the side thickness defect scenario has been resolved. If it is determined that the defect scenario has been resolved, the predetermined area representing the side thickness defect may be removed from the image, video and/or animation of the 3D roll press, and the quality parameter of the material displayed on the quality checking unit 150 may be normally corrected and changed.

It is illustrated in FIG. 13 that the image, video and/or animation representing part of the 3D roll press is displayed on the apparatus operating unit 140, but the present disclosure is not limited thereto, and the apparatus operating unit 140 may include an image, a video, and/or an animation of the same shape as the actual roll press. With this configuration, the user may effectively learn in advance how to respond to problems that may occur in the roll pressing process, and the simulation apparatus may effectively determine whether or not the problem has been resolved based on the user's input or action received.

It is illustrated in FIGS. 10 to 13 that there are the total thickness defect scenario, the operator side thickness scenario, the drive side thickness scenario, the side thickness defect scenario, and the like, but the plurality of scenarios may further include other defect scenarios that may occur in the roll press.

In addition, in FIGS. 10 to 13, it has been described that only a single defect scenario is executed among the total thickness defect scenario, the operator side thickness scenario, the drive side thickness scenario, the side thickness defect scenario, but the present disclosure is not limited thereto, and two or more defect scenarios may occur in combination.

Figure 14:
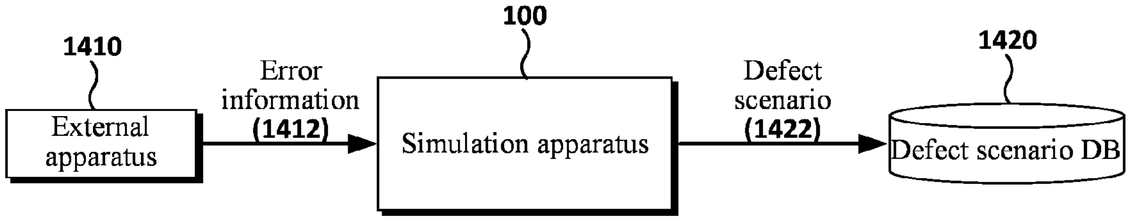
FIG. 14 illustrates an example in which a defect scenario has occurred according to an embodiment of the present disclosure.

FIG. 14 illustrates an example in which a defect scenario 1422 is generated according to an embodiment of the present disclosure. As illustrated in the figure, the simulation apparatus 100 may communicate with an external device (e.g., secondary battery production equipment) 1410 and a defect scenario DB 1420 and exchange data and/or information required for generating the defect scenario 1422.

According to an embodiment, when a malfunction occurs in an external device 1410, the simulation apparatus 100 may receive or obtain error information 1412 related to the malfunction from the external device 1410. Here, the error information 1412 may include operation information of the external device 1410 when the malfunction occurs and the quality change level of a material produced by the external device 1410. In this case, the simulation apparatus 100 may determine condition values and setting values of a 3D model apparatus (e.g., a 3D roll press apparatus) and/or each quality parameter value of the quality information and generate a defect scenario 1422 having the condition values and the setting values of the determined 3D model apparatus and/or the quality parameter values to respond to the corresponding error information 1412. The generated defect scenario 1422 may be stored and managed in the defect scenario DB 1420. For example, the simulation apparatus 100 may determine condition values and setting values of a 3D model apparatus and/or each quality parameter value of the quality information and generate a defect scenario 1422 to respond to the error information 1412 by using an arbitrary algorithm for generating a defect scenario 1422 and/or a trained machine learning model.

According to an embodiment, the processor may convert the operation information of the external device 1410 into a first set of parameters related to the operation of the 3D model apparatus and convert the quality change level of a material produced by the external device 1410 into a second set of parameters related to the quality information related to the quality of a material produced by the 3D model apparatus. Then, the processor may determine the category of a malfunction occurring in the external device 1410 using the converted first set of parameters and second set of parameters and generate a defect scenario based on the determined category, the first set of parameters, and the second set of parameters.

FIG. 14 assumes that a defect scenario occurs when a malfunction occurs in the external apparatus 1410, but the present disclosure is not limited to the assumption; for example, a defect scenario may be predetermined by an arbitrary user. In another example, a defect scenario may be generated by randomly determining setting values, condition values, and quality information related to the 3D model apparatus within a predetermined, abnormal range. Based on the configuration above, a user may be trained using a defect scenario generated based on a malfunction occurring in actual work environments, thereby effectively improving the ability to respond to defects.

Figure 15:
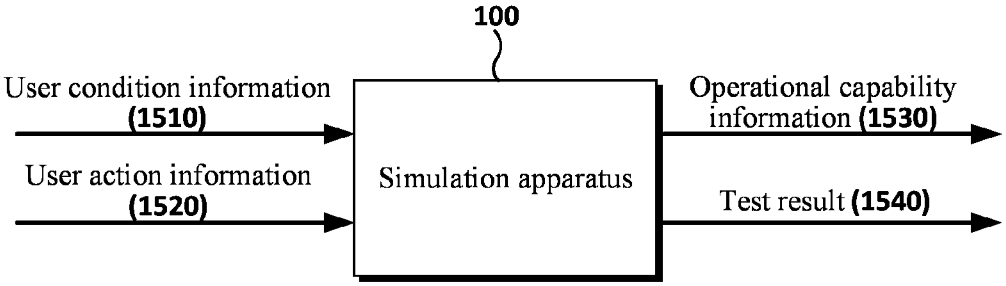
FIG. 15 illustrates an example in which operational capability information and a test result are generated according to an embodiment of the present disclosure.

FIG. 15 illustrates an example in which operational capability information 1530 and a test result 1540 are generated according to an embodiment of the present disclosure. As described above, when a defect scenario occurs, the simulation apparatus 100 may receive user condition information 1510 and user action information 1520 from a user and, based on the received user condition information 1510 and user action information 1520, determine whether the defect scenario has been resolved.

According to an embodiment, when it is determined that a defect scenario has been resolved, the simulation apparatus 100 may calculate a progress time and a loss value of the defect scenario while the defect scenario is in progress and, based on the calculated progress time and loss value, generate the operational capability information 1530 for the 3D model apparatus of a user account. In this case, a test result 1540 may be output together with the operational capability information 1530. For example, a user related to the corresponding user account may take a test for an arbitrary defect scenario, and when all defect scenarios related to a specific 3D model apparatus are resolved according to a predetermined criterion, the simulation apparatus 100 may determine that the corresponding user has passed a simulation test for the specific 3D model apparatus.

Figure 16:
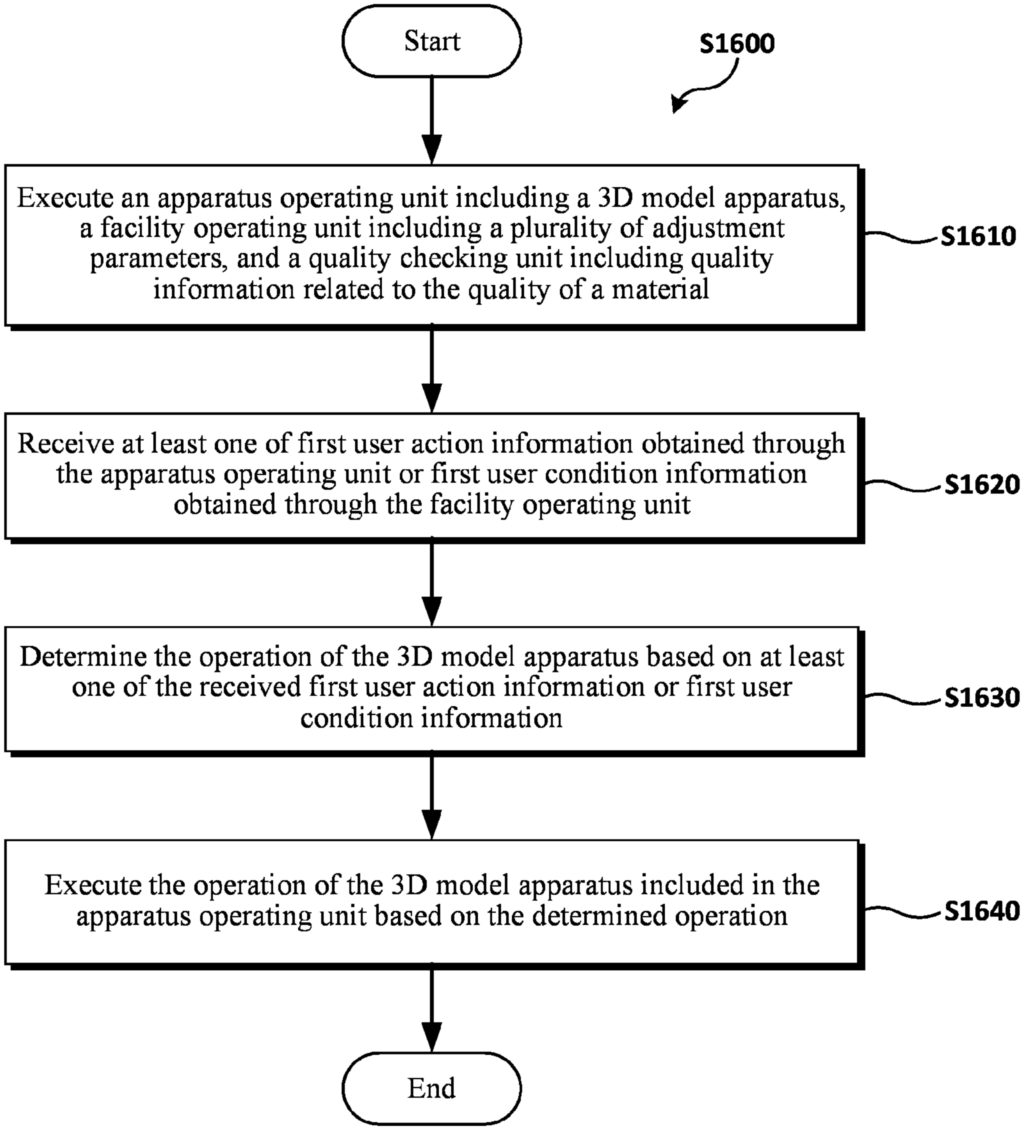
FIG. 16 illustrates an example of a simulation method for secondary battery production according to an embodiment of the present disclosure.

FIG. 16 illustrates an example of a simulation method S1600 for secondary battery production according to an embodiment of the present disclosure. The simulation method S1600 for secondary battery production may be performed by a processor (e.g., at least one processor of a simulation apparatus). As illustrated in the figure, the simulation method S1600 for secondary battery production may be initiated as the processor executes an apparatus operating unit including a 3D model apparatus related to secondary battery production, a facility operating unit including a plurality of adjustment parameters for determining the operation of the 3D model apparatus, and a quality checking unit including quality information related to the quality of a material produced by the 3D model apparatus S1610.

The processor may obtain at least one of first user action information obtained through the apparatus operating unit or first user condition information obtained through the facility operating unit S1620. Here, the first user condition information may include information related to a value corresponding to at least one adjustment parameter among a plurality of adjustment parameters.

The processor may determine the operation of the 3D model apparatus based on at least one of the first user action information or the first user condition information obtained S1630. In addition, the processor may execute the operation of the 3D model apparatus included in the apparatus operating unit based on the determined operation S1640. When receiving the first user action information, the processor may determine whether the received first user action information corresponds to a predetermined operating condition of the 3D model apparatus and approve the operation of the 3D model apparatus when it is determined that the first user action information corresponds to the predetermined operating condition of the 3D model apparatus.

According to an embodiment, the processor may determine one or more quality parameters for determining the quality of a material produced by the 3D model apparatus and, while the operation of the 3D model apparatus is executed, calculate a value corresponding to each of the determined one or more quality parameters based on the operation of the 3D model apparatus in execution. In addition, the processor may generate quality information related to the quality of a material produced by the 3D model apparatus based on the calculated value corresponding to each of the one or more quality parameters.

According to an embodiment, the processor may determine one or more defect scenarios among a plurality of defect scenarios related to a malfunction of the 3D model apparatus and change at least one of the 3D model apparatus's operation or quality information related to the quality of a material based on the determined one or more defect scenarios. Then, the processor may receive at least one of second user action information or second user condition information for resolving the determined one or more defect scenarios and, based on at least one of the received second user action information or second user condition information, correct the changed operation of the 3D model apparatus. In addition, while the corrected operation of the 3D model apparatus is executed, the processor may calculate a value corresponding to each of a plurality of quality parameters related to the quality of a material produced by the 3D model apparatus based on the operation of the 3D model apparatus in execution. In this case, the processor may correct the quality information related to the quality of a material produced by the corrected 3D model apparatus based on the calculated value corresponding to each of the plurality of quality parameters and, by using the corrected quality information, determine whether one or more defect scenarios have been resolved.

Figure 17:
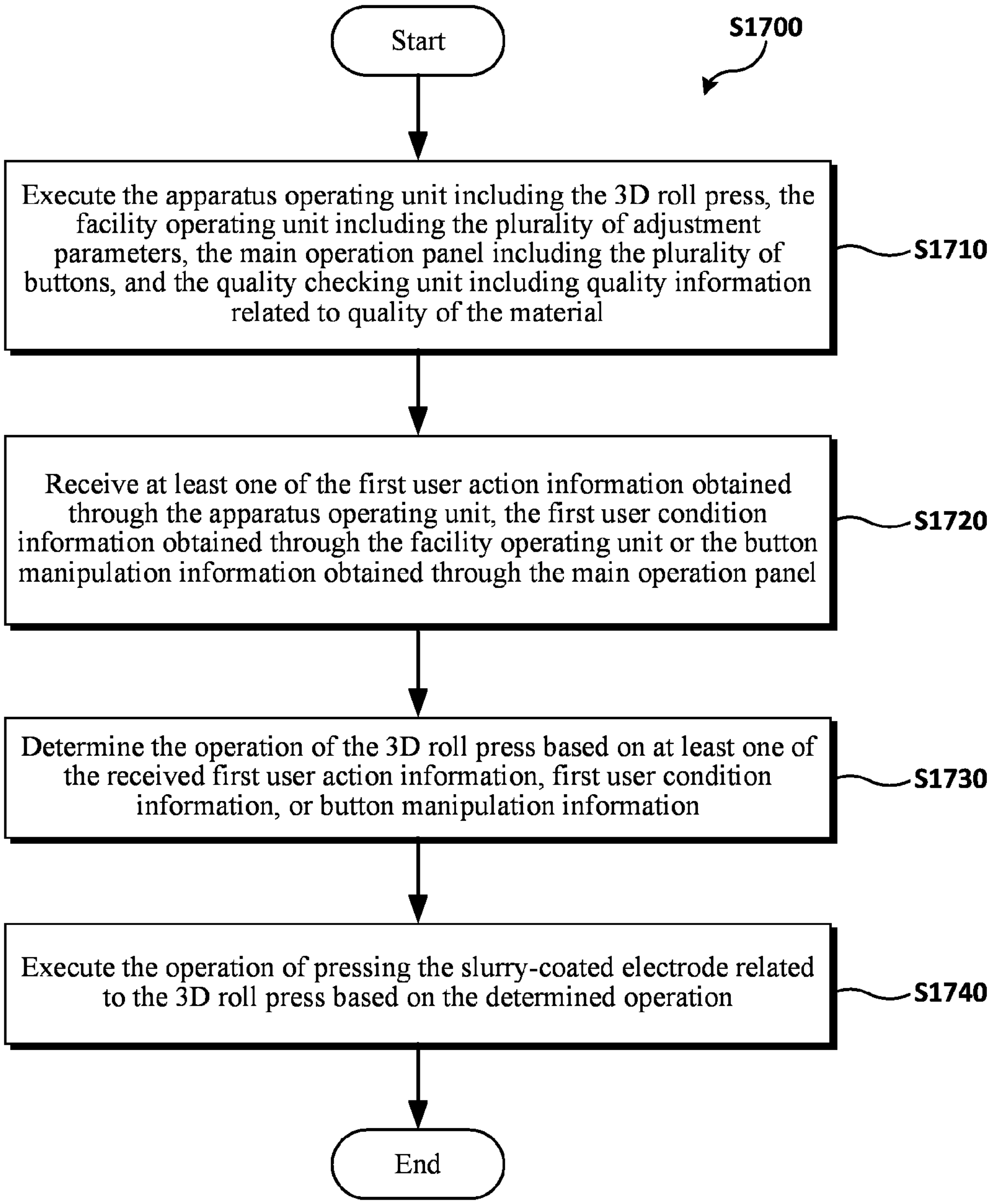
FIG. 17 illustrates an example of a simulation method of a roll press for secondary battery production according to an embodiment of the present disclosure.

FIG. 17 illustrates an example of a simulation method S1700 of a roll press apparatus for secondary battery production according to an embodiment of the present disclosure. The simulation method S1700 of the roll press for secondary battery production may be performed by a processor (e.g., at least one processor of a simulation apparatus). As illustrated in the figure, the simulation method S1700 of the roll press for secondary battery production may be initiated as the processor executes the apparatus operating unit including the 3D roll press related to the secondary battery production, the facility operating unit including a plurality of adjustment parameters for determining the operation of the 3D roll press, the main operation panel including a plurality of buttons for operating the 3D roll press, and the quality checking unit including quality information related to the quality of the material produced by the 3D roll press S1710.

The processor may obtain at least one of first user action information obtained through the apparatus operating unit, button manipulation information obtained through the main operation panel, or first user condition information obtained through the facility operating unit S1720. In addition, the processor may determine the operation of the 3D roll press based on at least one of the obtained first user action information, button manipulation information, or first user condition information S1730. In addition, the processor may execute the operation of passing the coated electrode between the rotating rolling rolls related to the 3D roll press to press the coated electrode to a certain thickness S1740.

According to an embodiment, the processor may change the adjustment parameter displayed on the facility operating unit based on the first user action information. In addition, when the processor receives the button manipulation, and it is determined that the received button manipulation information corresponds to a predetermine button manipulation, the processor may approve the operation of the 3D roll press.

According to an embodiment, the processor may operate the 3D roll press in animation, display a user action guide image for inducing a user action on the apparatus operating unit, display a button manipulation guide image for inducing a button manipulation on the main operation panel, or display a user condition input guide image for inducing a user condition input on the facility operating unit based on the 3D roll press training scenario.

In addition, the processor may determine one or more quality parameters for determining the quality of a material produced by the 3D roll press and, while the operation of the 3D roll press is executed, calculate a value corresponding to each of the determined one or more quality parameters based on the operation of the 3D roll press in execution. In addition, the processor may generate quality information related to the quality of a material produced by the 3D roll press based on the calculated value corresponding to each of the one or more quality parameters.

According to an embodiment, the processor may determine one or more defect scenarios among a plurality of defect scenarios related to a malfunction of the 3D roll press and change at least one of the operation of the 3D roll press or quality information related to the quality of a material based on the determined one or more defect scenarios. For example, the plurality of defect scenarios may include the total thickness defect scenario, the operator side thickness defect scenario, the drive side thickness defect scenario, and the side thickness defect scenario. In this case, each defect scenario may be resolved by arbitrary user condition information and user action information input from a user.

Figure 18:
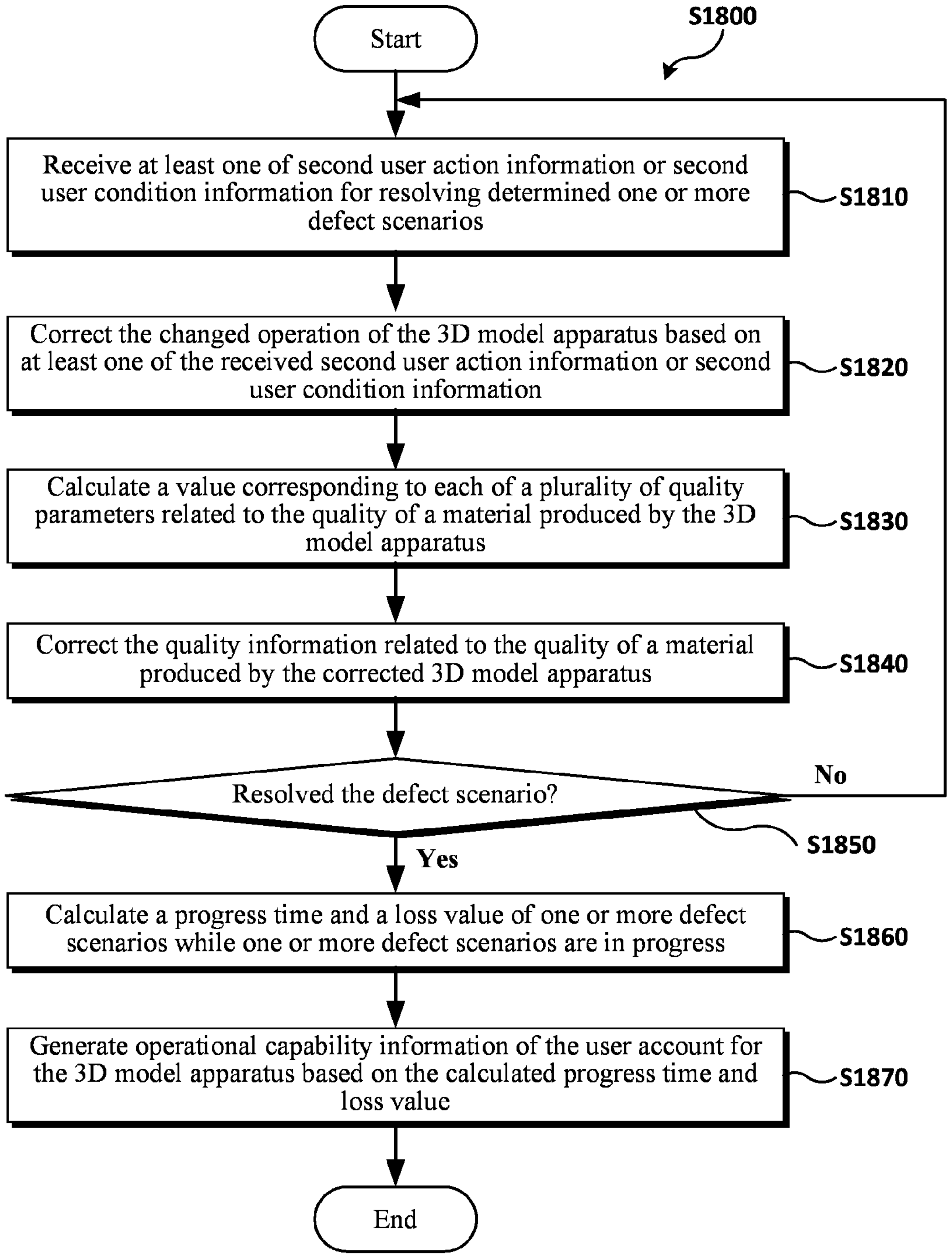
FIG. 18 illustrates an example of a method of calculating a test result according to an embodiment of the present disclosure.

FIG. 18 illustrates an example of a method of calculating a test result S1800 according to an embodiment of the present disclosure. The method of calculating a test result S1800 may be performed by a processor (e.g., at least one processor of a simulation apparatus). As illustrated in the figure, the method of calculating a test result S1800 may be initiated as the processor receives at least one of second user action information or second user condition information for resolving determined one or more defect scenarios S1810.

As described above, the processor may correct the changed operation of the 3D model apparatus based on at least one of the received second user action information or second user condition information S1820. In addition, while the corrected operation of the 3D model apparatus is executed, the processor may calculate a value corresponding to each of a plurality of quality parameters related to the quality of a material produced by the 3D model apparatus based on the operation of the 3D model apparatus in execution S1830. In this case, the processor may correct the quality information related to the quality of a material produced by the corrected 3D model apparatus based on the calculated value corresponding to each of the plurality of quality parameters S1840.

Then, the processor may determine whether one or more defect scenarios have been resolved using the corrected quality information and/or the setting values and condition values of the 3D model apparatus S1850. When it is determined that the defect scenario has not been resolved, the processor may again generate or obtain the second user action information and the second user condition information using the information input by the user.

When it is determined that one or more defect scenarios have been resolved, the processor may calculate a progress time and a loss value of one or more defect scenarios while one or more defect scenarios are in progress S1860. In addition, based on the calculated progress time and loss value, the processor may generate operational capability information of the user account for the 3D model apparatus S1870. Here, the operational capability information may include, but is not limited to, a progress speed and accuracy calculated using a progress time and a loss value, and may further include the user's test score and whether the user has passed the test. In this case, one user account may be assigned to each user performing secondary battery production; the operational capability information generated based on the user's progress time for a defect scenario and a loss value may be stored or managed in conjunction with the user account.

Figure 19:
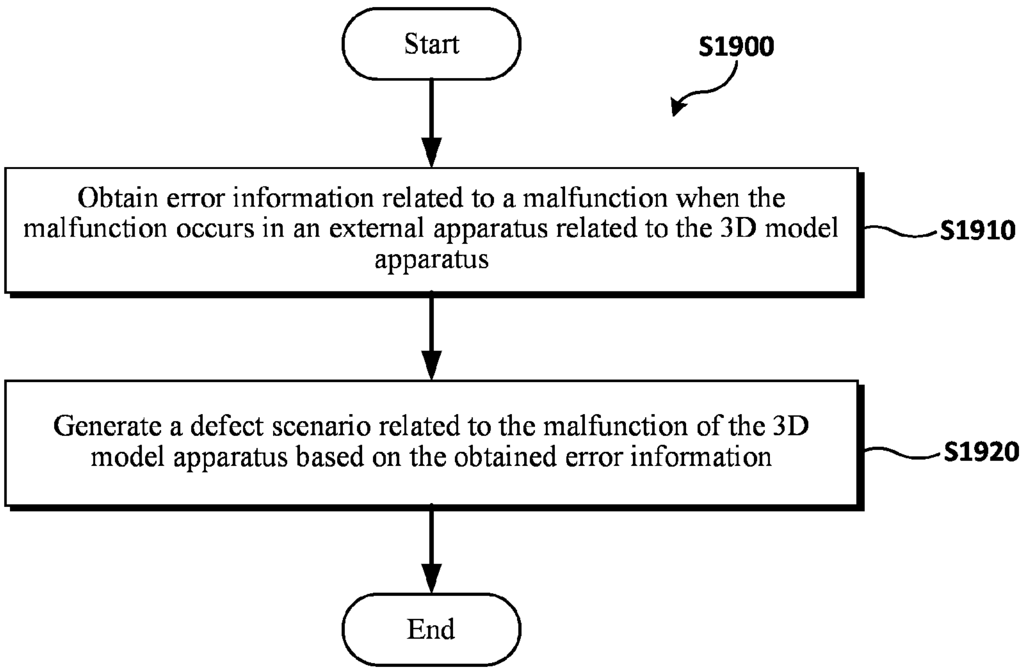
FIG. 19 illustrates an example of a method of generating a defect scenario according to an embodiment of the present disclosure.

FIG. 19 illustrates an example of a method of generating a defect scenario S1900 according to an embodiment of the present disclosure. The method of generating a defect scenario S1900 may be performed by a processor (e.g., at least one processor of a simulation apparatus). As illustrated in the figure, the method of generating a defect scenario S1900 may be initiated as the processor obtains error information related to a malfunction when the malfunction occurs in an external apparatus related to the 3D model apparatus S1910.

The processor may generate a defect scenario related to a malfunction of the 3D model apparatus based on the obtained error information S1920. Here, the error information may include each adjustment parameter value and setting values of actual secondary battery production equipment related to the 3D model apparatus, obtained when the corresponding production equipment malfunctions. For example, when the quality of a material produced by secondary battery production equipment gets out of a predetermined normal range, it may be determined that a malfunction has occurred; when it is determined that a malfunction has occurred, the processor may obtain error information related to the malfunction and generate a defect scenario related to the malfunction of the 3D model apparatus based on the obtained error information.

Figure 20:
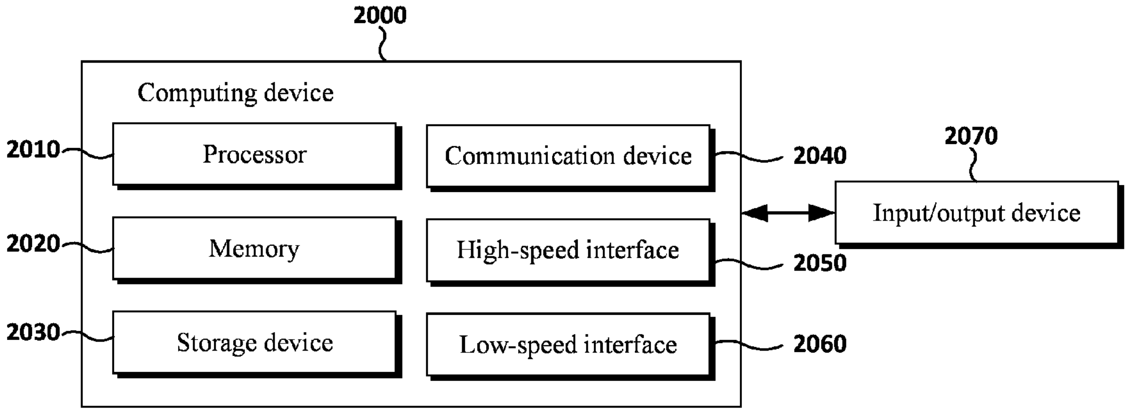
FIG. 20 illustrates an exemplary computing device for performing the method and/or embodiments.

FIG. 20 illustrates an exemplary computing device 2000 for performing the method and/or embodiments. According to an embodiment, the computing device 2000 may be implemented using hardware and/or software configured to interact with a user. Here, the computing device 2000 may include the simulation apparatus (100 of FIG. 1). For example, the computing device 2000 may be configured to support virtual reality (VR), augmented reality (AR), or mixed reality (MR) environments but is not limited thereto. The computing device 2000 may include a laptop computer, a desktop computer, a workstation, a personal digital assistant, a server, a blade server, and a mainframe computer, which is not limited thereto. The constituting elements of the computing device 2000 and connection relationships and functions of the constituting elements are intended to be illustrative and not intended to limit the implementations of the present disclosure described and/or claimed herein.

The computing device 2000 includes a processor 2010, a memory 2020, a storage device 2030, a communication device 2040, a high-speed interface 2050 connected to the memory 2020 and a high-speed expansion port, and a low-speed interface 2060 connected to a low-speed bus and a low-speed storage device. Each of the constituting elements 2010, 2020, 2030, 2040, 2050, 2060 may be interconnected using a variety of buses, mounted on the same main board, or mounted and connected in other suitable ways. The processor 2010 may be configured to process instructions of a computer program by performing basic arithmetic, logic, and input/output operations. For example, the processor 2010 may process instructions stored in the memory 2020 and the storage device 2030 and/or instructions executed within the computing device 2000 and display graphic information on an external input/output device 2070 such as a display device combined with the high-speed interface 2050.

The communication device 2040 may provide a configuration or a function for the input/output device 2070 and the computing device 2000 to communicate with each other through a network and provide a configuration or a function to support the input/output device 2070 and/or the computing device 2000 to communicate with another external apparatus. For example, a request or data generated by the processor of the external apparatus according to an arbitrary program code may be transmitted to the computing device 2000 through a network under the control of the communication device 2040. Conversely, a control signal or a command provided under the control of the processor 2010 of the computing device 2000 may be transmitted to another external device through the communication device 2040 and a network.

FIG. 20 assumes that the computing device 2000 includes one processor 2010 and one memory 2020, but the present disclosure is not limited to the assumption; the computing device 2000 may be implemented using a plurality of memories, a plurality of processors, and/or a plurality of buses. In addition, although FIG. 20 assumes that one computing device 2000 is employed, the present disclosure is not limited to the assumption, and a plurality of computing devices may interact with each other and perform operations required to execute the method described above.

The memory 2020 may store information in the computing device 2000. According to an embodiment, the memory 2020 may include a volatile memory unit or a plurality of memory units. Additionally or alternatively, the memory 2020 may be composed of a non-volatile memory unit or a plurality of memory units. In addition, the memory 2020 may be implemented using a different type of computer-readable medium, such as a magnetic disc or an optical disc. In addition, an operating system and at least one program code and/or instruction may be stored in the memory 2020.

The storage device 2030 may be one or more mass storage devices for storing data for the computing device 2000. For example, the storage device 2030 may be configured to include a hard disc; a magnetic disc such as a portable disc; an optical disc; a semiconductor memory device such as an erasable programmable read-only memory (EPROM), an electrically erasable PROM (EEPROM), and a flash memory; and a computer-readable medium including a CD-ROM or DVD-ROM disc; or the storage device 2030 may be configured to include the computer-readable medium. In addition, the computer program may be implemented tangibly in the computer-readable medium.

The high-speed interface 2050 and the low-speed interface 2060 may be used for interaction with the input/output device 2070. For example, an input device may include a camera including an audio sensor and/or an image sensor, a keyboard, a microphone, and a mouse; an output device may include a display, a speaker, and a haptic feedback device. In another example, the high-speed interface 2050 and the low-speed interface 2060 may be used for interfacing with a device in which a configuration or function for performing input and output operations is integrated into one entity, such as a touch screen.

According to an embodiment, the high-speed interface 2050 manages bandwidth-intensive operations for the computing device 2000, while the low-speed interface 2060 manages less bandwidth-intensive operations than the high-speed interface 2050, where the above functional assignment has been made merely for an illustrative purpose. According to an embodiment, the high-speed interface 2050 may be coupled to high-speed expansion ports capable of accommodating the memory 2020, the input/output device, and various expansion cards (not shown). In addition, the low-speed interface 2060 may be coupled to the storage device 2030 and low-speed expansion ports. Additionally, the low-speed expansion port, which may include various communication ports (e.g., USB, Bluetooth, Ethernet, and wireless Ethernet), may be coupled to one or more input/output devices 2070, such as a keyboard, a pointing device, and a scanner, or a networking device, such as a router or a switch, through a network adaptor.

The computing device 2000 may be implemented in many different forms. For example, the computing device 2000 may be implemented as a standard server or a group of standard servers. Additionally or alternatively, the computing device 2000 may be implemented as part of a rack server system or may be implemented as a personal computer, such as a laptop computer. In this case, constituting elements from the computing device 2000 may be combined with other constituting elements of an arbitrary mobile device (not shown). The computing device 2000 may include one or more other computing devices or may be configured to communicate with one or more computing devices.

FIG. 20 assumes that the input/output device 2070 is not included in the computing device 2000, but the present disclosure is not limited to the assumption; the input/output device 2070 may be configured to be integrated into the computing device 2000 to form a single device. In addition, FIG. 20 illustrates that the high-speed interface 2050 and/or the low-speed interface 2060 are illustrated as being configured separately from the processor 2010; however, the present disclosure is not limited thereto, and the high-speed interface 2050 and/or the low-speed interface 2060 may be configured to be included in the processor 2010.

The method and/or various embodiments described above may be implemented in digital electronic circuitry, computer hardware, firmware, software, and/or a combination thereof. Various embodiments of the present disclosure may be executed by a data processing device, for example, one or more programmable processors and/or one or more computing devices; or implemented as a computer-readable medium and/or a computer program stored on a computer-readable medium. The computer program may be written in any form of programming language including a compiled language or an interpreted language and may be distributed in any form such as a stand-alone program, a module, or a subroutine. The computer program may be distributed via a plurality of computing devices connected through one computing device and the same network and/or a plurality of distributed computing devices connected through a plurality of different networks.

The method and/or various embodiments described above may be performed by one or more processors configured to execute one or more computer programs that process, store, and/or manage arbitrary functions by operating based on input data or generating output data. For example, the method and/or various embodiments of the present disclosure may be performed by a special-purpose logic circuit such as a Field Programmable Gate Array (FPGA) or an Application Specific Integrated Circuit (ASIC); an apparatus and/or a system for performing the method and/or various embodiments of the present disclosure may be implemented as a special-purpose logic circuit such as an FPGA or an ASIC.

The one or more processors executing the computer program may include a general-purpose or special-purpose microprocessor and/or one or more processors of an arbitrary type of digital computing device. The processor may receive instructions and/or data from each of the read-only memory and the random-access memory or may receive instructions and/or data from the read-only memory and the random-access memory. In the present disclosure, the constituting elements of a computing device performing the method and/or embodiments may include one or more processors for executing instructions; and one or more memories for storing instructions and/or data.

According to an embodiment, the computing device may send and receive data to and from one or more mass storage devices for storing data. For example, the computing device may receive data from a magnetic or optical disc and transmit data to the magnetic or optical disc. A computer-readable medium suitable for storing instructions and/or data related to a computer program may include any form of non-volatile memory including a semiconductor memory device such as an Erasable Programmable Read-Only Memory (EPROM), an Electrically Erasable PROM (EEPROM), and a flash memory device; however, the present disclosure is not limited thereto. For example, a computer-readable medium may include a magnetic disc such as an internal hard disc or a removable disc, a photomagnetic disk, a CD-ROM disc, and a DVD-ROM disc.

To provide interaction with a user, the computing device may include a display device (e.g., a cathode ray tube (CRT) or a liquid crystal display (LCD)) for providing or displaying information to the user and a pointing device (e.g., a keyboard, a mouse, or a trackball) through which the user may provide input and/or commands to the computing device by the user; however, the present disclosure is not limited to the specific example above. In other words, the computing device may further include any other kind of device for providing interaction with the user. For example, the computing device may provide any form of sensory feedback to the user for interaction with the user, including visual feedback, auditory feedback, and/or tactile feedback. In response to the feedback, the user may provide input to the computing device through various gestures including a visual expression, voice, and motion.

In the present disclosure, various embodiments may be implemented in a computing device that includes a back-end component (e.g., a data server), a middleware component (e.g., an application server), and/or a front-end component. In this case, the constituting elements may be interconnected by any form or any medium of digital data communication, such as a communication network. According to an embodiment, the communication network includes a wired network such as Ethernet, a wired home network (Power Line Communication), a telephone line communication device, and RS-serial communication; a wireless network such as a mobile communication network, a wireless LAN (WLAN), Wi-Fi, and Bluetooth; or a combination of the wired and wireless networks. For example, the communication network may include a local area network (LAN) and a wide area network (WAN).

A computing device based on the illustrative embodiments described herein may be implemented using hardware and/or software configured to interact with a user, including a user device, a user interface (UI) device, a user terminal, or a client device. For example, the computing device may include a portable computing device such as a laptop computer. Additionally or alternatively, the computing device may include a Personal Digital Assistants (PDA), a tablet PC, a game console, a wearable device, an Internet of Things (IoT) device, a virtual reality (VR) device, and an augmented reality (AR) device but is not limited thereto. The computing device may further include other types of devices configured to interact with the user. In addition, the computing device may include a portable communication device (e.g., a mobile phone, a smartphone, or a wireless cellular phone) suitable for wireless communication over a network, such as a mobile communication network. The computing device may be configured to communicate wirelessly with a network server using wireless communication technologies and/or protocols such as Radio Frequency (RF), Microwave Frequency (MWF), and/or Infrared Ray Frequency (IRF).

Various embodiments of the present disclosure, including specific structural and functional details, are illustrative in nature. Accordingly, the embodiments of the present disclosure are not limited to those described above and may be implemented in various other forms. In addition, the terms used in the present disclosure are intended for describing part of embodiments and should not be construed as limiting the embodiments. For example, singular words and the descriptions above may be construed to include plural forms unless the context dictates otherwise.

Unless defined otherwise, terms used in the present disclosure, including technical or scientific terms, may convey the same meaning understood generally by those skilled in the art to which the present disclosure belongs. Among the terms used in the present disclosure, commonly used terms, such as those defined in ordinary dictionaries, should be interpreted to convey the same meaning in the context of related technology.

The present disclosure has been described with reference to particular embodiments; however, various modifications and changes may be made without departing from the technical scope of the present disclosure that may be understood by those skilled in the art to which the present disclosure belongs. In addition, it should be understood that the modifications and changes fall within the technical scope of the appended claims.

What is claimed is:

1. A simulation apparatus for secondary battery production, the simulation apparatus comprising:

a memory configured to store at least one instruction; and at least one processor configured to execute the at least one instruction stored in the memory, wherein the at least one instruction includes instructions for:

executing an apparatus operating unit including a 3D roll press related to secondary battery production, a facility operating unit including a plurality of adjustment parameters for determining an operation of the 3D roll press, a main operation panel including a plurality of buttons for operating the 3D roll press, and a quality checking unit including quality information related to quality of a material produced by the 3D roll press;

obtaining at least one of first user action information obtained through the apparatus operating unit, button manipulation information obtained through the main operation panel, or first user condition information obtained through the facility operating unit;

determining an operation of the 3D roll press based on at least one of the obtained first user action information, button manipulation information or first user condition information; and executing an operation of the 3D roll press based on the determined operation wherein the at least one instruction further includes instructions for:

determining one or more case training scenarios among a plurality of case training scenarios related to the quality of the material produced by the 3D roll press; and changing at least one of the operation of the 3D roll press or the quality information related to the quality of the material based on the determined one or more case training scenarios;

wherein the case training scenario includes at least one of:

a total thickness defect scenario in which a total thickness of the material deviates from an upper or lower limit of specification, an operator side thickness defect scenario in which an operator side thickness of the material deviates from an upper or lower limit of the specification, a drive side thickness defect scenario in which a drive side thickness of the material deviates from an upper or lower limit of the specification, or a side thickness defect scenario in which a side thickness of the material deviates from an upper or lower limit of the specification.

2. The simulation apparatus of claim 1, wherein the at least one instruction further includes instructions for:

changing an adjustment parameter displayed on the facility operating unit based on the first user action information obtained through the apparatus operating unit.

3. The simulation apparatus of claim 1, wherein the at least one instruction further includes instructions for:

executing a 3D roll press training scenario based on an operating process of the 3D roll press;

executing, according to the 3D roll press training scenario, at least one of operating the 3D roll press in animation, displaying a user action guide image on the apparatus operating unit, displaying a button manipulation guide image on the main operation panel, or displaying a user condition input guide image on the facility operating unit;

obtaining at least one of the first user action information, the button manipulation information, or the first user condition information; and changing at least one of the apparatus operating unit, the facility operating unit, or the main operation panel based on at least one of the obtained first user action information, button manipulation information or first user condition information.

4. The simulation apparatus of claim 3, wherein the 3D roll press training scenario includes at least one of a work specification checking training step, an edge position control (EPC) adjustment training step, a tension adjustment training step, a roll gap adjustment training step, a counter-pressure adjustment training step, or a quality checking training step.

5. The simulation apparatus of claim 1, wherein the at least one instruction further includes instructions for:

determining one or more quality parameters for determining the quality of the material produced by the 3D roll press;

calculating a value corresponding to each of the determined one or more quality parameters based on the operation of the 3D roll press being executed while the operation of the 3D roll press is in execution; and generating quality information related to the quality of the material produced by the 3D roll process based on the calculated value corresponding to each of the determined one or more quality parameters and displaying the quality information on the quality checking unit.

6. The simulation apparatus of claim 1, wherein the at least one instruction further includes instructions for:

executing at least one defect scenario of the total thickness defect scenario, the operator side thickness defect scenario, the drive side thickness defect scenario, and the side thickness defect scenario;

obtaining at least one of second user action information of dragging at least a partial area of the 3D roll press or second user condition information of changing an adjustment parameter of the facility operating unit;

correcting the 3D roll press in animation based on at least one of the obtained second user action information or second user condition information;

calculating a value corresponding to each of one or more quality parameters related to quality of a material produced by the corrected 3D roll press; and correcting the quality information related to the quality of the material produced by the corrected 3D roll press based on the calculated value corresponding to each of the one or more quality parameters and displaying the corrected quality information on the quality checking unit.

7. The simulation apparatus of claim 6, wherein the at least one instruction further includes instructions for:

outputting guide information including condition information and action information required to resolve the one or more defect scenarios.

8. A simulation method of roll press for secondary battery production, the method being executed by at least one processor and comprising:

executing an apparatus operating unit including a 3D roll press related to secondary battery production, a facility operating unit including a plurality of adjustment parameters for determining an operation of the 3D roll press, a main operation panel including a plurality of buttons for operating the 3D roll press, and a quality checking unit including quality information related to quality of a material produced by the 3D roll press;

obtaining at least one of first user action information obtained through the apparatus operating unit, button manipulation information obtained through the main operation panel, or first user condition information obtained through the facility operating unit;

determining an operation of the 3D roll press based on at least one of the obtained first user action information, button manipulation information or first user condition information; and executing an operation of the 3D roll press based on the determined operation, and determining one or more case training scenarios among a plurality of case training scenarios related to the quality of the material produced by the 3D roll press; and changing at least one of the operation of the 3D roll press or the quality information related to the quality of the material based on the determined one or more case training scenarios;

wherein the case training scenario includes at least one of:

a total thickness defect scenario in which a total thickness of the material deviates from an upper or lower limit of specification, an operator side thickness defect scenario in which an operator side thickness of the material deviates from an upper or lower limit of the specification, a drive side thickness defect scenario in which a drive side thickness of the material deviates from an upper or lower limit of the specification, or a side thickness defect scenario in which a side thickness of the material deviates from an upper or lower limit of the specification.

9. The simulation method of claim 8, further comprising:

changing an adjustment parameter displayed on the facility operating unit based on the first user action information obtained through the apparatus operating unit.

10. The simulation method of claim 8, further comprising:

executing a 3D roll press training scenario based on an operating process of the 3D roll press;

executing, according to the 3D roll press training scenario, at least one of operating the 3D roll press in animation, displaying a user action guide image on the apparatus operating unit, displaying a button manipulation guide image on the main operation panel, or displaying a user condition input guide image on the facility operating unit;

obtaining at least one of the first user action information, the button manipulation information, or the first user condition information; and changing at least one of the apparatus operating unit, the facility operating unit, or the main operation panel based on at least one of the obtained first user action information, button manipulation information or first user condition information.

11. The simulation method of claim 10, wherein the 3D roll press training scenario includes at least one of a work specification checking training step, an edge position control (EPC) adjustment training step, a tension adjustment training step, a roll gap adjustment training step, a counter-pressure adjustment training step, or a quality checking training step.

12. The simulation method of claim 8, further comprising:

determining one or more quality parameters for determining the quality of the material produced by the 3D roll press;

calculating a value corresponding to each of the determined one or more quality parameters based on the operation of the 3D roll press being executed while the operation of the 3D roll press is in execution; and generating quality information related to the quality of the material produced by the 3D roll process based on the calculated value corresponding to each of the determined one or more quality parameters and displaying the quality information on the quality checking unit.

13. The simulation method of claim 8, further comprising:

executing at least one defect scenario of the total thickness defect scenario, the operator side thickness defect scenario, the drive side thickness defect scenario, and the side thickness defect scenario;

obtaining at least one of second user action information of dragging at least a partial area of the 3D roll press or second user condition information of changing an adjustment parameter of the facility operating unit;

correcting the 3D roll press in animation based on at least one of the obtained second user action information or second user condition information;

calculating a value corresponding to each of one or more quality parameters related to quality of a material produced by the corrected 3D roll press; and correcting the quality information related to the quality of the material produced by the corrected 3D roll press based on the calculated value corresponding to each of the one or more quality parameters and displaying the corrected quality information on the quality checking unit.

14. The simulation method of claim 13, further comprising:

outputting guide information including condition information and action information required to resolve the one or more defect scenarios.

15. A computer program stored in a computer-readable medium provided to execute the method according to claim 8 on a computer.

* * * * *